United States Patent
Altebaeumer et al.

(10) Patent No.: US 8,362,553 B2
(45) Date of Patent: Jan. 29, 2013

(54) MULTIFUNCTIONAL TAPE

(75) Inventors: Thomas Heinz-Helmut Altebaeumer, Oxford (GB); Stephen Day, Chipping Norton (GB); Jonathan Heffernan, Oxford (GB)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 13/084,877

(22) Filed: Apr. 12, 2011

(65) Prior Publication Data

US 2011/0186879 A1 Aug. 4, 2011

Related U.S. Application Data

(62) Division of application No. 12/413,613, filed on Mar. 30, 2009, now Pat. No. 7,947,548.

(30) Foreign Application Priority Data

Apr. 1, 2008 (GB) .................................. 0805850.5

(51) Int. Cl.
*H01L 29/76* (2006.01)
*H01L 29/94* (2006.01)
*H01L 31/062* (2006.01)
*H01L 31/113* (2006.01)
*H01L 31/119* (2006.01)

(52) U.S. Cl. .......... 257/334; 257/69; 257/272; 257/265; 257/E21.051; 257/E21.077; 257/E21.218; 257/E21.245; 257/E21.305; 257/E21.332; 257/E21.361; 257/E21.613; 257/E21.632

(58) Field of Classification Search .................... 257/69, 257/265, 272, 285, 288, 334, E21.051, E21.077, 257/E21.218, E21.245, E21.305, E21.332, 257/E21.361, E21.613, E21.632
See application file for complete search history.

(56) References Cited

U.S. PATENT DOCUMENTS

| | | | |
|---|---|---|---|
| 6,262,483 B1 | 7/2001 | Shen | |
| 6,872,645 B2 | 3/2005 | Duan et al. | |
| 6,920,260 B2 | 7/2005 | Zhang et al. | |
| 7,067,328 B2 | 6/2006 | Dubrow et al. | |
| 7,068,898 B2 | 6/2006 | Buretea et al. | |
| 7,073,157 B2 | 7/2006 | DeHon et al. | |
| 7,091,120 B2 | 8/2006 | Buretea et al. | |
| 7,193,239 B2 | 3/2007 | Leedy | |

(Continued)

FOREIGN PATENT DOCUMENTS

| GB | 2442768 | 4/2008 |
|---|---|---|
| GB | 2 458 906 A | 10/2009 |

(Continued)

OTHER PUBLICATIONS

Yu Huang et al. "Nanowires for Integrated Multicolor Nanophotonics", small, vol. 1, No. 1, p. 142-147 (2005).

(Continued)

*Primary Examiner* — David Nhu
(74) *Attorney, Agent, or Firm* — Renner, Otto, Boisselle & Sklar, LLP

(57) ABSTRACT

A method includes forming elongate structures on a first substrate, such that the material composition of each elongate structure varies along its length so as to define first and second physically different sections in the elongate structures. First and second physically different devices are then defined in the elongate structures. Alternatively, the first and second physically different sections may be defined in the elongate structures after they have been fabricated. The elongate structures may be encapsulated and transferred to a second substrate. The invention provides an improved method for the formation of a circuit structure that requires first and second physically different devices to be provided on a common substrate. In particular, only one transfer step is necessary.

11 Claims, 10 Drawing Sheets

U.S. PATENT DOCUMENTS

| | | | |
|---|---|---|---|
| 7,947,548 B2* | 5/2011 | Altebaeumer et al. ........ | 438/199 |
| 8,173,908 B2* | 5/2012 | Altebaeumer et al. ........ | 174/261 |
| 2002/0172820 A1 | 11/2002 | Majumdar et al. | |
| 2002/0175408 A1 | 11/2002 | Majumdar et al. | |
| 2003/0089899 A1 | 5/2003 | Lieber et al. | |
| 2003/0201521 A1 | 10/2003 | Tsai et al. | |
| 2004/0075464 A1 | 4/2004 | Samuelson et al. | |
| 2004/0079278 A1 | 4/2004 | Kamins et al. | |
| 2004/0112964 A1 | 6/2004 | Empedocles et al. | |
| 2004/0135951 A1 | 7/2004 | Stumbo et al. | |
| 2005/0079659 A1 | 4/2005 | Duan et al. | |
| 2005/0110064 A1 | 5/2005 | Duan et al. | |
| 2005/0161662 A1 | 7/2005 | Majumdar et al. | |
| 2005/0180194 A1 | 8/2005 | Kang | |
| 2005/0180195 A1 | 8/2005 | Kang | |
| 2005/0181587 A1 | 8/2005 | Duan et al. | |
| 2005/0255303 A1 | 11/2005 | Sawatari et al. | |
| 2006/0151820 A1 | 7/2006 | Duan et al. | |
| 2006/0169788 A1 | 8/2006 | Empedocles et al. | |
| 2006/0211183 A1 | 9/2006 | Duan et al. | |
| 2006/0237537 A1 | 10/2006 | Empedocles et al. | |
| 2006/0256059 A1 | 11/2006 | Stumbo et al. | |
| 2007/0012980 A1 | 1/2007 | Duan et al. | |
| 2007/0102747 A1 | 5/2007 | Chen et al. | |
| 2007/0120167 A1 | 5/2007 | Duan et al. | |
| 2007/0161213 A1 | 7/2007 | Hiura et al. | |
| 2007/0164270 A1 | 7/2007 | Majumdar et al. | |
| 2007/0176824 A1 | 8/2007 | Stumbo et al. | |
| 2007/0228439 A1 | 10/2007 | Duan et al. | |
| 2008/0092938 A1 | 4/2008 | Majumdar et al. | |
| 2008/0105296 A1 | 5/2008 | Samuelson et al. | |
| 2008/0142784 A1 | 6/2008 | Samuelson et al. | |
| 2008/0188064 A1 | 8/2008 | Samuelson et al. | |
| 2008/0196932 A1 | 8/2008 | Sawatari et al. | |
| 2009/0102037 A1 | 4/2009 | Kim | |
| 2009/0242260 A1 | 10/2009 | Altebaeumer et al. | |
| 2010/0003516 A1 | 1/2010 | Majumdar et al. | |
| 2010/0012180 A1 | 1/2010 | Day et al. | |
| 2010/0155696 A1 | 6/2010 | Duan et al. | |
| 2011/0045660 A1 | 2/2011 | Romano et al. | |
| 2011/0193183 A1 | 8/2011 | Agarwal et al. | |
| 2011/0312163 A1 | 12/2011 | Romano et al. | |

FOREIGN PATENT DOCUMENTS

| | | |
|---|---|---|
| JP | 2004-532133 A | 10/2004 |
| JP | 2005-235377 A | 9/2005 |
| JP | 2005-532181 A | 10/2005 |
| JP | 2005-311249 A | 11/2005 |
| JP | 2006-507692 A | 3/2006 |
| JP | 2010-500559 A | 1/2010 |
| JP | 2010-506735 A | 3/2010 |
| JP | 2011-519729 A | 7/2011 |
| WO | 2009/123332 A1 | 10/2009 |

OTHER PUBLICATIONS

Yu Huang et al. "Logic Gates and Computation from Assembled Nanowire Building Blocks", Science, vol. 294, p. 1313-1317 (2001).

Michael C. McAlpine et al. "High-Performance Nanowire Electronics and Photonics and Nanoscale Patterning on Flexible Plastic Substrates", Proceedings of the IEEE, vol. 93, No. 7, p. 1357-1363 (2005).

Search Report for corresponding application No. GB0805850.5 dated Jun. 29, 2008.

Copending U.S. Appl. No. 12/413,613, filed Mar. 30, 2009.

Copending U.S. Appl. No. 12/413,660, filed Mar. 30, 2009.

A.W. Topol et al., "Three-dimensional integrated circuits", IBM Journal of Research & Development, vol. 50, No. 4/5, p. 491-506 (2006).

J.H. Ahn et al., "Heterogeneous Three-Dimensional Electronics by Use of Printed Semiconductor Nanomaterials", Science vol. 314, p. 1754-1757 (2006).

A. Javey et al., "Layer-by-Layer Assembly of Nanowires for Three-Dimensional, Multifunctional Electronics" Nano Letters vol. 7, No. 3, p. 773-777 (2007).

L Demoracski et al., "Connecting and Configuring Defective Nano-Scale Networks for DNA self-Assembly", Nano-Networks and Workshops, 2006, NanoNet'06. 1$^{st}$ International Conference on pp. 1-5 (ISBN: 1-4244-0391-X).

British Search Report for related British Application No. GB 0805848.9 dated Jun. 30, 2008.

Office Action dated Aug. 18, 2011 for U.S. Appl. No. 12/413,660, filed Mar. 30, 2009.

Office Action for U.S. Appl. No. 12/413,613 (now U.S. Patent No. 7,947,548) dated Nov. 30, 2010.

* cited by examiner a.)

b.)

c.)

d.)

a.)

b.)

MULTIFUNCTIONAL TAPE

This is a divisional application of U.S. Nonprovisional application Ser. No. 12/413,613 filed on Mar. 30, 2009, now U.S. Pat. No. 7,947,548, which claims priority under 35 U.S.C. §119(a) to British Patent Application No. 0805850.5 filed on Apr. 1, 2008, the entire contents of which are hereby incorporated by reference.

FIELD OF THE INVENTION

The present invention relates to structures containing elongate structures in which two physically different sections are defined which subsequently allow the formation of physically different devices, and to the formation of such structures. It particularly relates to the formation of devices containing low dimensional structures and performing physically different functions onto receiver substrates on which those devices could not be fabricated directly to achieve monolithic integration.

BACKGROUND OF THE INVENTION

Monolithic integration may be not feasible because it may be either technically not possible or not cost effective.

An example where the monolithic integration may not be a cost-effective option is the monolithic integration of a Complementary-Metal Oxide Semiconductor (CMOS) interface on a MEMS (Micro Electro-Mechanical) sensor, which often requires running through a costly CMOS process which won't cover the entire substrate area.

The monolithic integration may be technically not viable because either the substrate onto which the devices are to be integrated cannot withstand the process conditions (e.g. high temperature steps), the required material cannot be deposited with sufficient quality onto the foreign substrate (e.g. due to structural incompatibilities) or the process flow may be incompatible with devices previously fabricated on the receiver substrate (e.g. high temperature steps after metallisation of previous devices or contamination issues).

Display technologies are an example where the structural incompatibilities in conjunction with the low thermal budget of the glass substrate inhibit the formation of single-crystalline semiconductors on amorphous glass substrate and where it is advantageous to integrate high performance semiconducting devices with differing functionality. Examples of such devices include npn transistors and pnp transistors (e.g. to form CMOS circuits), pressure sensors (e.g. for haptic interfaces), light sensors (e.g. for adapting the display to the ambient lighting conditions) and last but not least red, green and blue Light Emitting Devices (LEDs) (e.g. for emissive displays) on a transparent substrate such as a glass substrate or plastic substrates which may be flexible.

These devices may contain elongate low dimensional structures, which are formed onto a suitable substrate but can be subsequently transferred onto a different substrate. Examples of devices which may contain elongate low dimensional structures are npn transistors, pnp transistors, sensors, capacitors, red, green and blue LEDs. The bulk of the receiver substrate may consist of glass, polymers, metals, or semiconductors.

Where physically different structures consisting of or containing low dimensional structures are formed on a formation substrate and are transferred to a target substrate, it is desirable to be able to exercise a degree of control over the arrangement of these devices on the target substrate after transfer/re-orientation, both with respect to predefined features on the target substrate and with respect to each other.

The term "low dimensional structure" as used herein refers to a structure that has at least one dimension that is much less than at least a second dimension.

The term "elongate structure" as used herein refers to a structure having at least two dimensions that are much less than a third dimension. The definition of an "elongate structure" lies within the definition of a "low dimensional structure", and a nanowire is an example of a structure that is both a low dimensional structure and an elongate structure.

Low dimensional structures that are not elongate structures are known. For example, a 'platelet', which has two dimensions of comparable magnitude to one another and a third (thickness) dimension that is much less than the first two dimensions constitutes a "low dimensional structure" but is not an "elongate structure".

For the avoidance of any doubt, the term "physically different" means in this context that those sections of the elongate low dimensional structure which determine the device performance differ in at least one of the following points:

1. material composition—e.g. doping concentrations, doping type (p and n doped regions), semiconducting material with different band gaps;
2. material composition profile—e.g. doping profiles along the structure and/or presence of heterojunctions;
3. cross-sectional geometry—e.g. different side facets at different sections along the low dimensional elongate structures;
4. density of elongate low-dimensional structures—e.g. the elongate low-dimensional structures may branch into several elongate low-dimensional structures, or some of the elongate low-dimensional structures may be shorter than others;
5. orientation of elongate low-dimensional structures—e.g. the elongate low-dimensional structures may change their orientation at well defined positions along their lengths (kinks); and
6. cross-sectional dimensions of elongate low-dimensional structures—e.g. different cross sectional areas of the elongate low dimensional structures.

Additionally, the physically different sections may also differ in their length.

Methods are known for transferring structural features from a first substrate to a second substrate. However, at present no suitable techniques are available for applying a high density of structural features with an elongate/low dimensional geometry to a receiver substrate such that all of the following desiderata can be met:

1. The elongate features consist of at least two different segments/regions, which are distinguishable from each other by different variations in their material composition along their longest dimension.
2. The elongate features are transferred to a target substrate with one and only one transfer step.
3. The spatial arrangement and spacing of the elongate/low dimensional structures within devices defined on the target substrate can be substantially controlled.
4. The elongate low dimensional structures are oriented on the target substrate such that any arbitrary symmetric or asymmetric distribution of the material composition progresses along their longest dimension in the same manner for all structures.
5. At least one edge of the elongate low dimensional structures is aligned with one or more common planes.
6. Physically different devices containing the same number of elongate low dimensional structures with cross sections which scale in a substantially similar manner can be obtained in close proximity independent of yield and reproducibility issues related to the fabrication of the elongate low dimensional structures.

Control over one or more (and preferably all) the factors set out above is necessary to permit the use of such elongate or low dimensional structures to improve existing and develop new nanotechnologies.

U.S. Pat. No. 7,067,328 discloses a method for transferring nanowires from a donor substrate (for example the substrate on which they are formed) to a receiver substrate. This is achieved by disposing an adhesion layer on the receiver substrate, and mating it with the donor substrate. A degree of alignment and ordering of the nanowires on the receiver substrate is achieved by moving the donor substrate and receiver substrate relative to one another while they are in contact.

U.S. Pat. No. 6,872,645 teaches a method of positioning and orienting elongate nanostructures on a surface by harvesting them from a first substrate into a liquid solution and then flowing the solution along fluidic channels formed between a second substrate and an elastomer stamp. The nanostructures adhere to the second substrate from the solution with a preferred orientation corresponding to the direction of fluid flow.

U.S. Pat. No. 7,091,120 discloses a process in which a liquid material is disposed on a population of nanowires that are attached to a first substrate with their longitudinal axes perpendicular to the plane of the first substrate. The material is then processed in order to cause it to solidify into a matrix that is designed to adhere to the nanowires and act as a support for the nanowires during the process of separating the nanowires from a first substrate and transferring them to a second substrate. Optionally, once the composite of nanowires embedded in the matrix material has been successfully transferred to the second substrate the matrix material can be removed to leave only the nanowires.

U.S. Pat. No. 7,091,120 also discloses an extension to this process whereby the composite of nanowires embedded in the matrix material is lithographically patterned into blocks. The blocks are then applied to a second substrate such that the embedded nanowires are aligned with their longitudinal axes parallel to the plane of the second substrate.

In one embodiment of the method of U.S. Pat. No. 7,091,120 the composite material is formed by unidirectionally disposing the matrix material on an ordered or random arrangement of nanowires. The directional flow of the matrix material induces the nanowires to orientate within the composite material parallel to the plane of the first substrate.

The method of U.S. Pat. No. 7,091,120 has a number of disadvantages, as follows:

Deposition of the matrix as a liquid may disturb the alignment/orientation of the elongate nanostructures on the donor substrate. Hence, it is challenging to control the arrangement and/or orientation of the elongate structures contained in each block relative to the external dimensions of the block.

The absolute dimensions and aspect ratio of the composite blocks are limited by the resolution, alignment accuracy and anisotropy of the lithographic and etch processes used to pattern the blocks (generally, only blocks with a low aspect ratio can be obtained). Consequently, it is difficult to control the number of elongate structures contained in each block or, again, the arrangement of elongate structures contained in each block relative to the external dimensions of the block.

The method does not easily enable nanostructures to be reoriented from a perpendicular orientation relative to the first substrate to a parallel orientation relative to the second substrate.

US patent application No. 2004/0079278 discloses a method of forming a composite material comprising an array of isolated nanowires and a matrix that fills in the gaps between the materials. This method is designed to fabricate monolithic photonic band gap composite structures that cannot easily be transferred between different substrates.

U.S. Pat. No. 7,068,898 discloses a composite structure comprising nanostructures dispersed in a polymer matrix with random and 'less random' orientations. The application is directed to light concentrators and waveguides that take advantage of the anisotropic emission pattern to ensure light is redirected in the guide or concentrator as desired.

Small, Vol. 1, No. 1, p. 142 (2005) describes how three LEDs were fabricated using one uniformly p-doped nanowire which is crossed by three identical n-doped nanowires forming three pn junctions. Each pn junction emits light at the same wavelength. This publication suggests the assembly of three pn junctions each emitting light at different wavelength by replacing the three identical n-doped nanowires with nanowires consisting of three different suitable materials (GaN, CdS, and CdSe). The same approach of assembling crossing nanowires is used to demonstrate the integration of one LED with one FET, where the difference in functionality is solely achieved by using different operation conditions (voltages). Science, Vol. 294 p. 1313 (2001) uses the same assembly approach as Small, Vol. 1, No. 1, p. 142 (2005) to realise logic gates.

In both cases, the technology described requires two assembly steps to fabricate a cross-bar arrangement. Even if one could envisage a similar approach by replacing the p-doped bottom nanowire with patterned p-doped Si, the transfer and assembly technology described (a fluid assembly method) would not allow to obtain devices consisting of different material compositions in well defined spots using only one transfer step. Furthermore, it would be impossible to assemble nanowires with asymmetric doping profiles with identical orientation. Therefore, the device performance of each group of devices can't be optimised independent of each other unless several transfers are performed. Also, the method is not suited to assemble nanowires with asymmetric doping profiles which are often desired if the operating conditions (voltages) are asymmetric as in the case of transistors.

Proceedings of the IEEE, Vol. 93, No. 7, p. 1357 (2005) describes a logic gate realised by using a single, uniformly doped nanowire. Similar to the method described in Small, Vol. 1, No. 1, p. 142 (2005), the logic operation requiring different devices (e.g. resistor and transistor) is achieved by applying different operating conditions (voltages) to different segments of the nanowire. This approach suffers from the same drawbacks described in the previous publications as far as the device optimisation by different and asymmetric doping profiles is concerned.

Co-pending UK patent application No. 0620134.7 (UK patent application publication No. GB2442768A) describes a method of making encapsulated low dimensional structures such that they are suitable to be transferred to a different substrate. During the transfer the number of elongate structures, their alignment, spacing, and their orientation are maintained. Furthermore, these structures can be subsequently processed into devices using conventional lithographic methods in combination with subtractive (e.g. dry etching) and additive techniques (e.g. metal deposition). The number of elongate structures within each device is well controlled. It is possible to divide each group after the transfer into smaller segments to yield multiple identical devices out of each group (e.g. several npn transistors).

US2005/0180194 discloses a "nano tube cell" containing alternating regions of p-type doping and n-type doping. This cell may be incorporated in a structure such that two PNPN diode switches are defined in the tube cell. US2005/0180194 does not describe in detail how the structure is fabricated. The structure shows a symmetric IV curve, which implies that the two diode switches are identical to one another.

US2007/0102747 relates to a carbon nano tube FET (CNT-FET) structure, and proposes a structure incorporating an n-type FET and a p-type FET. However, the two FETs are physically identical, and the n-type FET and p-type FET are obtained by applying different gate voltages to the two structures.

US2003/0089899 describes formation of regions of different doping type in a nanoscale wire to produce a single device.

SUMMARY OF THE INVENTION

The current invention addresses the challenge providing an improved method of fabricating devices consisting of physically different low-dimensional structures on a receiver substrate such that as many as possible, preferably all, of the following desiderata can be met:

1. The elongate low-dimensional structures are transferred to a target substrate with one and only one transfer step.

2. The spatial arrangement and spacing of the elongate low dimensional structures within a group (defined on the formation substrate) can be substantially controlled during the transfer.

3. The transferred elongate features consist of at least two different sections, which are physically different from each other.

4. The transferred elongate low dimensional structures within each group are oriented such that any arbitrary symmetric or asymmetric distribution of the material composition progresses along their longest dimension in the same manner for all structures in a group.

5. In addition, at least one edge of the elongate low dimensional structures can be aligned with one or more common planes.

6. Physically different devices containing the same number of elongate low dimensional structures with cross sections which scale in a substantially similar manner can be obtained in close proximity independent of yield and reproducibility issues related to the fabrication of the elongate low dimensional structures.

"Cross sections which scale in a substantially similar manner" means that the one-dimensional parameters describing one cross section scale substantially in proportion to the one-dimensional parameters describing another cross section. Thus, two circular cross sections scale substantially "similar" to one another, if the radius of one cross section scales in proportion to the radius of the other cross section (both belonging to the same elongate low-dimensional structure) for all elongate low dimensional structures. In other words, variation in the ratio of the two radii measured within each elongate low-dimensional structure is considerably less from one elongate low-dimensional structure to another than variation in the absolute values of the radii. Similarly, if one cross section is circular and another cross section measured within the same elongate low dimensional structure describes a hexagon, the edge length of the hexagon divided by the radius within each elongate low-dimensional structure varies considerably less from structure to structure than the absolute values of the radius and the edge length. If elongate structures are tapered (e.g. they have the shape of a truncated cone), it is important that the measurements taken along the length of each low dimensional elongate structure are taken at equivalent positions.

The term "elongate low-dimensional structure" includes, but is not restricted to, nanowires and nanotubes which may be obtained by additive methods (e.g. chemical vapour deposition, molecular beam epitaxy, chemical synthesis) or subtractive methods (e.g. reactive ion etching) or any combination.

A first aspect of the present invention provides a method comprising:

forming elongate structures on a first substrate, at least one of the material composition, the material composition profile, the cross-section geometry, the cross-sectional dimensions and the orientation of each elongate structure varying along its length whereby at least first and second physically different sections are defined in the elongate structures; and forming at least first and second devices, the first device comprising the first section of one or more of the elongate structures and the second device comprising the second section of one or more of the elongate structures. This allows the formation for two physically different devices.

Before the fabrication of the physically different devices, the elongate structures may be encapsulated and transferred to a second substrate.

For two sections to be "physically different" from one another, those regions/sections of the elongate structures which determine the device performance must differ between the devices in at least one of the following points: material composition; material composition profile; cross-sectional geometry; crystallographic orientation of elongate low-dimensional structures; change in orientation (kinking) within one physically different section (e.g. the kink is important to obtain the desired device performance) cross-sectional dimensions of elongate low-dimensional structures. For two devices to be "physically different" from one another, those regions/sections of the elongate structures which determine the device performance must differ between the devices in at least one of the following points: material composition; material composition profile; cross-sectional geometry; density of elongate low-dimensional structures; orientation of elongate low-dimensional structures; cross-sectional dimensions of elongate low-dimensional structures. (These points are explained in more detail above.) In other words, the physical difference is solely defined by differences in geometry and/or material composition and not established by for example implementing a different electrostatic environment (e.g. a different mode of operating a device). Thus, as an example, an npn transistor is a "physically different device" to a pnp transistor, since the material composition and material composition profile (in particular regarding the doping type and doping concentration) of those regions/sections of an npn transistor which determine the device performance are different from the material composition (in particular the doping type) of those regions/sections of a pnp transistor which determine the device performance. As a further example, two light-emitting devices that have the same general structure but that have active regions of different material composition so that the devices emit light at different wavelengths to one another are "physically different" devices. Moreover, any change in cross section of the elongate structures, which may be the geometry, the size or both, will give a physically different device. This is, because a change in any of these will result in a different device characteristic if all other parameters remain unchanged.

It should be noted that two "physically different" sections are not required to be physically different along their entire length. For example, if it is desired to fabricate an $n^+ n^- n^+$ transistor as a first device and an $p^+ n^- p^+$ transistor as a second device, the part of the elongate structure(s) that forms the $n^-$ region of the $n^+ n^- n^+$ transistor may in principle be identical to the part of the elongate structure(s) that forms the $n^-$ region of the $p^+ n^- p^+$ transistor. However, the overall part of the elongate structure(s) that forms the $n^+ n^- n^+$ transistor will be physically different from the overall part of the elongate structure(s) that forms the $p^+ n^- p^+$ transistor (owing to the different doping type required for the source and drain regions which also results in different material composition profiles in the two overall parts of the elongate structure(s) that form the two transistors).

It will also be apparent from the above that the first [second] section is not required to have a material composition, material composition profile, cross-section geometry, the cross-sectional dimensions and orientation that are uniform along the length of the first [second] section, although they may all be uniform along the length of the first [second] section. In general one or more of these properties may vary along the length of the first [second] section so that the first [second] section may contain two or more sub-sections with one or more property varying between one sub-section and another. Where this is the case, the first section and the second section may be considered as physically different if at least one subsection of the first section differs from the corresponding subsection of the second section in one of the properties specified.

A second aspect of the present invention provides a method comprising: forming free-standing elongate structures on a first substrate; defining at least first and second physically different sections in the elongate structures, at least one of the material composition, the material composition profile, the cross-section geometry, the cross-sectional dimensions or the orientation of the elongate structures being different between the first region and the second region; and forming at least first and second devices, the first device comprising the first section of one or more of the elongate structures and the second device comprising the second section of one or more of the elongate structures.

By "free-standing" is meant that the elongate structures are making connect with the first substrate only at one of their ends or only at both of their ends (ie, they adopt an inverted "U" shape), when seen from the side. Free-standing elongate structures include, for example, elongate structures that are connected to the substrate only at one of their ends and extend generally away from the substrate.

The method of the second aspect results in the first and second physically different sections being defined in the elongate structures after the elongate structures have been fabricated, whereas the method of the first aspect results in the first and second physically different sections being defined in the elongate structures as the elongate structures are grown on the first substrate. Apart from this, the method of the second aspect is generally similar to the method of the first aspect.

The method of the second aspect may further comprise severing a connection between the elongate structures and the first substrate. This may be done either before or after the first and second physically different sections have been defined in the elongate structures.

The first and second physically different sections may be defined in the elongate structures after the elongate structures have been transferred to a second substrate (preferably with the structures having been encapsulated before transfer to preserve their position relative to one another).

Alternatively, the first and second physically different sections may be defined in the elongate structures after fabrication of the elongate structures but while the elongate structures are still on the first substrate, with the elongate structures being subsequently transferred to a second substrate if desired (preferably with the structures having been encapsulated before transfer to preserve their position relative to one another). This may be done, for example, by depositing a masking material over the elongate structures, patterning the masking material to expose selected segments of the elongate structures, and modifying the exposed segments of the elongate structures such that they are physically different to the non-exposed parts of the elongate structures.

The first and second devices are defined at different points along the length of the elongate structures, in that at least one region which determines the performance of the first device occurs at a different point along the length of the elongate structures to at least one region which determines the performance of the second device. This allows the performance of the first device to be optimised substantially independently of optimising the performance of the second device. (However, it is possible for the first and second devices to overlap, ie for a section of the elongate structures to be common to both the first device and the second device.)

The method of the first or second aspect may comprise encapsulating the elongate structures.

The method of the first or second aspect may comprise rotating the elongate structures such that their longest dimension extends parallel to the substrate surface.

After rotating the elongate structures, the elongate structures may be coplanar with one another.

The method of the first or second aspect may comprise transferring the elongate structures to a second substrate. In the second aspect, the transfer may be before or after definition of the first and second sections.

The elongate structures may be formed as a group; wherein encapsulating the elongate structures comprises encapsulating the group of elongate structure; and wherein defining the first and second devices comprises defining the first and second devices in the group of elongate structures.

In the first aspect, the elongate structures may be formed so as to be free-standing on the first substrate.

In the first or second aspect the elongate structures may be formed so as to extend generally perpendicular to the first substrate.

The invention allows the orientation of the elongate structures to be changed during transfer, so that the orientation of the elongate structures relative to the second substrate (after transfer) is different from the orientation of the elongate structures relative to the first substrate (before transfer).

In the first or second aspect the elongate structures may be transferred to the second substrate so as to extend generally parallel to the second substrate.

In the first or second aspect the first and second devices may be defined such that the active region of the first device comprises the first section and the active region of the second device comprises the second section. The invention is not however limited to this, and the first and second sections may constitute other parts (for example a contact) of the first and second devices. As an example if the two devices to be formed are an n+/n/n+ depletion mode transistor and a p+/n/p+ inversion mode transistor, these are physically different devices owing to the different material composition in the contact areas even though the devices have identical active device regions. In this case, the first section may comprise an n+ contact of the depletion mode transistor and the second section may comprise a p+ contact of the inversion mode transistor.

In general, the first device may comprise one or more sections in addition to the first section, and the second device may comprise one or more sections in addition to the second section.

In the first or second aspect defining the first and second devices may comprise forming at least one contact to the elongate structures.

In the first or second aspect a third sub-section of at least one of the elongate structures may be adapted for formation of a contact to the first device, and defining the first and second devices may comprise forming at least one contact to the third sub-section.

In the first or second aspect a fourth sub-section of at least one of the elongate structures may be adapted for formation of a contact to the second device, and defining the first and second devices may comprise forming at least one contact to the fourth sub-section.

In the first or second aspect defining the first and second devices may comprise severing the elongate structure between the first device and the second device.

In the first or second aspect defining the first and second devices may comprise partially removing the encapsulant so as to expose one or more portions of the elongate structures.

Partially removing the encapsulant may expose the third sub-section of the at least one elongate structure.

In the first or second aspect the method may comprise depositing an electrically conductive material over the exposed portion(s) of the elongate structures.

In the first or second aspect defining the at least first and second devices may comprise defining at least first and second groups of devices, the devices in the first group being not physically different from one another, the devices in the second group being not physically different from one another, and devices of the first group being physically different from devices of the second group.

In the first or second aspect encapsulating the elongate structures may comprise encapsulating the elongate structures in a transparent material.

In the first or second aspect encapsulating the elongate structures may comprise encapsulating the elongate structures in an electrically conductive material.

In the first or second aspect encapsulating the elongate structures may comprise encapsulating the elongate structures in an electrically insulating material.

A third aspect of the invention provides a circuit structure fabricated by a method of the first aspect or of the second aspect.

A fourth aspect of the invention provides a circuit structure comprising:

first and second devices disposed over or fabricated on a common substrate, each device containing elongate low-dimensional structures;

wherein the first device is in close proximity to the second device;

wherein at least one of the material composition, material composition profile, cross-section geometry, cross-sectional dimensions and orientation of the elongate low-dimensional structures of the first device differs from the material composition, material composition profile, cross-section geometry, cross-sectional dimensions and crystallographic orientation of the elongate low-dimensional structures of the second device, whereby the first device is physically different from the second device;

wherein the material composition, material composition profile, cross-section geometry, orientation of cross-sections, cross-sectional dimensions and orientation of the elongate low-dimensional structures of the first device are nominally the same for all elongate low-dimensional structures of the first device; and wherein the material composition, material composition profile, cross-section geometry, orientation of cross-sections, cross-sectional dimensions and orientation of the elongate low-dimensional structures of the second device are nominally the same for all elongate low-dimensional structures of the second device.

If the elongate low dimensional structures of the first device have the same orientation as the low dimensional structures of the second device they will also be substantially "in line" with each other. In other words, if the elongate low dimensional structures within the first device were extended towards the second device they would overlap with the elongate low dimensional structures of the second device. Also, if one elongate structure within one device has a larger cross section than the others, this would be also true for the corresponding elongate low dimensional structure in the other device. This allows the performance of one device to be matched to the performance of another device, because unintended variations in geometry are present in both devices to a similar degree.

By specifying that the material composition, etc. of the elongate low-dimensional structures of the first device are nominally the same for all elongate low-dimensional structures of the first device is meant that the variation in the material composition, etc. between the elongate low-dimensional structures of the first device is small compared to the average material composition (or intended material composition), etc. of the elongate low-dimensional structures of the first device. As far as doping concentrations are concerned, the material composition and/or material composition profiles preferably differ by no more than an order of magnitude from the average values, more preferably differ by no more than a factor of 2 from the average values or intended values, and even more preferably are within ±20% of the average values. All other properties are preferably within 25% of the nominal/intended value, and particularly preferably are within 10% of the nominal/intended value.

The reason for the wider window for doping concentrations is three-fold:

1. Doping concentrations are generally harder to control.

2. The device performance is comparably "insensitive" to slight variations in doping concentrations (e.g. in a planar configuration, the depletion width of a Schottky-contact/depletion mode device scales with 1/sqrt(concentration)).

3. In small-scale devices, larger variations are expected to become more likely due to statistical reasons (e.g. at a doping concentration of $10^{16}$ cm$^{-3}$ one would expect on average one doping atom in a 50 nm section of a nanowire with a 50 nm diameter).

The invention is not limited to a structure containing only two devices, and a structure of the invention may contain three or more devices.

An elongate structure of the first device may be continuous with an elongate structure of the second device.

An elongate structure of the first device may be not continuous with an elongate structure of the second device whereby the first device is physically separated from the second device.

The longest dimension of at least one elongate structure of the first device may lie substantially on the same axis as the longest dimension of at least one elongate structure of the second device. Preferably, for at least one elongate structure of the first device, an extension of its longest dimension would lie within the perimeter of an elongate structure of the second device (and vice versa).

The longest dimension of at least one elongate structure of the first device may lie substantially on the same axis as the longest dimension of at least one elongate structure of the second device, and the cross sectional geometry and the orientation of the cross-sectional geometry of these elongate structures may be substantially similar.

The first device and the second device may each include at least two elongate structures, and the separation between a pair of elongate structures in the first device may be substantially equal to the separation between a corresponding pair of elongate structures in the second device.

The first device may emit light, in use, in a first wavelength range and the second device may emit light, in use, in a second wavelength range different from the first wavelength range.

The first device may be a p-channel transistor whose conductance, in use, is dominated by hole transport and the second device may be a n-channel transistor whose conductance, in use, is dominated by electron transport.

The elongate structures may be coplanar with one another.

The structure may comprise a group of first devices and a group of second devices, wherein the material composition and material composition profile of the elongate low-dimensional structures of devices of the first group are nominally the same for all elongate low-dimensional structures of the first group; and wherein the material composition and material composition profile of the elongate low-dimensional structures of devices of the second group are nominally the same for all elongate low-dimensional structures of the second group.

In the current invention the low dimensional structures formed on the formation substrate may have a material composition, material composition profile, cross-section geometry, cross-sectional dimensions and/or orientation that varies along their largest dimension such that, if it is possible to form contacts in well defined locations along their largest dimension, two or more physically different devices may be obtained.

The term "contacts" includes electrical, optical, thermal and mechanical contacts, and any combination thereof.

The terms "material composition" and "material composition profile" include, but are not restricted to, doped semiconductors as well as hetero junctions.

In an embodiment of the current invention, encapsulated low dimensional structures are transferred to a receiver substrate such that it becomes or remains possible to form contacts anywhere along their largest dimension using at least one of the following techniques:

1. Additive (e.g. deposition, transfer)
   Deposition methods include but are not restricted to direct or indirect thermal evaporation, sputter deposition, chemical vapour deposition, spin coating, atomic layer deposition, and ink-jet printing.
   Transfer methods include dry transfer methods such as stamp-based transfers, and device bonding as well as wet transfer methods where the transfer of the desired structures occurs out of solution.
2. Subtractive (e.g. etching, sputtering, dissolving)
   Etching includes wet-chemical etching and dry etching (e.g. reactive ion etching, ion milling). Dry etching techniques may be combined with sputtering techniques.
3. Selective (e.g. self assembly, chemical functionalisation, local heating, local exposure to particles, local exposure to mechanical stress)
   Local heating may occur due to a localised exposure to an energy source (e.g. a focussed laser beam, selective exposure using a mask) or due to the energy absorbing properties of the elongate low dimensional structures or sections within the elongate low dimensional structures.
   Chemical functionalisation may utilise particular surface properties of the elongate low dimensional structures being defined by the material composition.
   Local exposure of particles includes lithographic methods such as photo-lithography and electron beam lithography but also focussed ion beam and local exposure to x-rays. Local exposure to mechanical stress includes imprint technologies.

The formation of contacts may be achieved by rotating high aspect ratio structures such that their shortest dimension, denoted 'w' in FIGS. 1(c) and 2(a) extends perpendicular of the receiver substrate, hence easing lateral structuring by application of lithographic methods.

The formation of contacts at well defined positions along each elongate low-dimensional structure may remain possible if the alignment and the orientation of high aspect ratio structures is preserved during rotation and transfer to a different substrate (hence their positions remain known).

High aspect ratio structures include elongate low-dimensional structures as well as the composite structures described in UK patent application No. 0620134.7.

In another embodiment of the current invention, the encapsulated low dimensional structures are processed such that contacts are formed in places along their largest dimension, which are particularly suited to obtain devices performing different physical functions. The position of these places is defined by:

1. The material composition of these places along the elongate low dimensional structures;
2. The material composition in between the places particularly suited for formation of contacts;
3. The physical extension of the material composition of these places along the elongate low dimensional structures;
4. The physical extension of the material composition in between the places particularly suited for formation of contacts; and The material composition in between the places particularly suited for formation of contacts may have any symmetric or asymmetric compositional profile which is suited to obtain the desired device performance.

In a further embodiment of the current invention, the encapsulated low dimensional structures may be processed such that they are separated to obtain multiple elongate low dimensional structures. The position where they are separated are defined by:

1. The material composition in between the places particularly suited to separate these elongate low dimensional structures if selective subtractive techniques are applied.
2. The position of those parts of the elongate low-dimensional structures which are important to achieve the desired device performance (e.g. contacts and active device regions).

The separation of the elongate low-dimensional structures may be achieved by using a suitable subtractive method in combination with a selective method. Examples of these methods are given above.

Advantages of the current invention over the prior art are as follows.

1. Only one transfer process is required to obtain a well defined number "n" of physically different devices (n>1) in well defined locations on the receiver substrate. Consequently, no alignment between different transfer steps is required. Furthermore, the final spacing between the physically different devices is solely determined by the precision of the techniques used to fabricate the elongate low-dimensional structures on the formation substrate. These techniques are additive, hence allowing in most cases the fabrication of physically different segments along these elongate low dimensional structures with greater precision than achievable with conventional lithographic techniques and device transfer techniques. As a result, two different devices may be manufactured in close proximity to one another and a greater device density can be obtained. However, other techniques to obtain physically different sections may be utilised before the structures are transferred to a receiver substrate.

2. Using the methods described in the prior art to fabricate "n" transferable and physically different groups of devices requires "n" separate fabrications—which are most likely done on "n" separate substrates if the previous point 1 is required. The current invention allows the fabrication of elongate low dimensional structures only once on one substrate. Hence, a large number of process steps to fabricate these elongate low dimensional structures or any transferable structure containing one or more of these elongate low dimensional structures are performed once only. This has the following advantages:

Fewer resources are required to fabricate these structures, making the process more inexpensive, faster or both.

Each process step is associated with a certain yield. Therefore, a reduction in process steps will improve the yield.

3. Often, the fabrication of the elongate low-dimensional structures is associated with a certain yield and reproducibility. This may cause variations in the number of elongate low-dimensional structures and their cross-sections. One example where this is often the case nanowires which are created by catalysed growth, where minor variations in the interface quality between the growth substrate and catalyst can impact the catalytic properties and the wetting properties of the catalyst which are thought to affect the nucleation yield and the nanowire cross section. In some applications, however, it is important to have physically different devices containing the same number of nanowires with substantially similar cross sections in close proximity. CMOS logic gates are such an example where the number of nanowires times the circumference of each nanowire determines the channel width. Here, the ratio of the channel width of the pnp device and the channel width of the npn device belonging to the same CMOS logic gate needs to stay within well controlled margins. Another example are light emitting devices for colour mixing where the colour obtained is more important than the absolute brightness. If, for example, a pixel display is realised with each pixel consisting of three LEDs, one emitting light in the red, one in the green and one in the blue spectrum, it may be more important to obtain reproducible colours than obtaining reproducible brightness. As the cross sectional area in each LED determines the output power, the ratio of the cross sections for the red, green and blue LEDs within each pixel needs to stay constant from pixel to pixel. Other applications may be in the fields of polarisation dependent photo-detectors and polarised light sources.

The structure which will be obtained by the method described in this invention achieves these requirements (same number of wires per device, similar cross sections, close and well defined proximity of the devices).

Additional objects, features, and strengths of the present invention will be made clear by the description below. Further, the advantages of the present invention will be evident from the following explanation in reference to the drawings.

BRIEF DESCRIPTION OF THE DRAWINGS

Preferred embodiments of the present invention will now be described by way of illustrative example with reference to the accompanying Figures in which.

DESCRIPTION OF THE EMBODIMENTS

Figure 1:
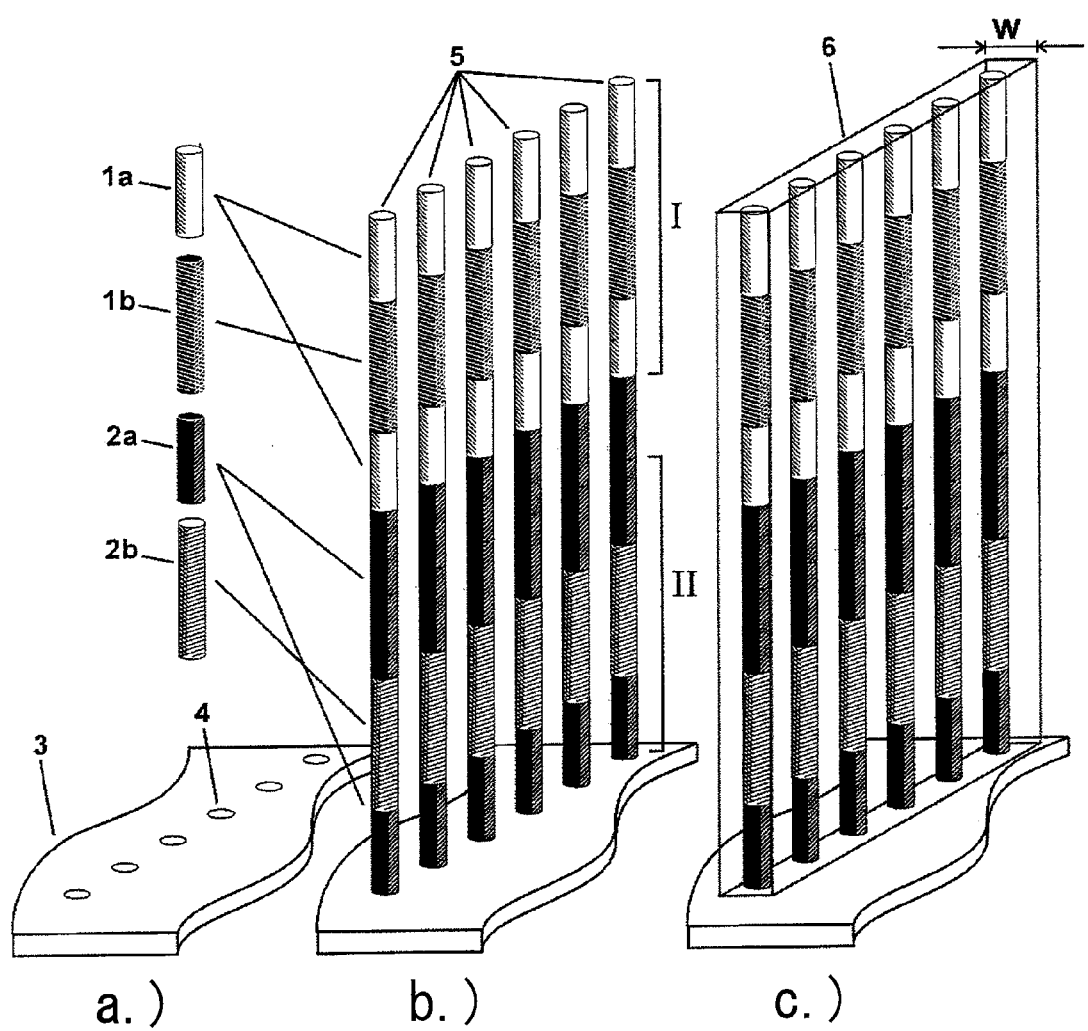
FIG. 1 shows the formation of a group of low dimensional structures on a substrate 3.

The invention will be described with reference to example in which the elongate structures are nanowires. The invention is not however limited to nanowires and may be applied to other elongate structures.

FIGS. 1(a) to 1(c) and FIGS. 2(a) to 2(d) show principal steps of a method according to one embodiment of the present invention.

Initially, a plurality of elongate low dimensional structures is formed over a substrate 3. The low dimensional structures may be formed on substrate 3 by an additive process, or they may be formed by subtractive methods, such as lithography and etching. In this embodiment the low dimensional structures 5 are nanowires, but the invention is not limited to these. In this embodiment the elongate low dimensional structures are formed to be free-standing on the substrate 3, for example such that the elongate low dimensional structures are connected to the substrate 3 only at one of their ends and extend generally away from the substrate.

One formation method suitable for use in the invention is a catalytic growth method. In such a growth method, a suitable catalyst 4 is initially disposed on the surface of the formation substrate 3 at every location where it is desired to form an elongate low-dimensional structure 5 (FIG. 1(a)). The catalyst 4 may be, for example, a metal catalyst. The catalyst may be deposited by, for example a combination of sub-micron lithography/imprinting and lift-off, or by the deposition of metal colloids.

Next, as shown in FIG. 1(b), elongate low-dimensional structures are formed at each location where the catalyst 4 was deposited on the surface of the substrate 3. Formation of elongate low-dimensional structures 5 does not occur at locations where the catalyst 4 is not present.

The low dimensional structures formed on the formation substrate preferably have a substantially unidirectional orientation. In FIG. 1(b) the elongate low-dimensional structures 5 are shown as oriented with their longitudinal axes generally perpendicular to the substrate 3.

The elongate low-dimensional structures may be formed by any suitable technique, for example by epitaxial vapour-liquid-solid or catalyst-free chemical vapour deposition or molecular beam epitaxy, or they may be formed by deposition of material in a porous sacrificial template. These are examples of "additive" formation processes, in which material is "added" so that a low-dimensional structure is formed at each location where the catalyst 4 was deposited. As an alternative, a subtractive formation process such as sub-micron lithography and etching may also be used. For example, silicon nanowires may be formed using an Au catalyst in a (111) surface of a silicon formation substrate. The material of the elongate low-dimensional structures can be any suitable material such as, for example, semiconductors, silicides, metal oxides, nitrides and any combination of the aforesaid materials. The elongate low-dimensional structures may be formed a single crystal low-dimensional structure.

The growth process thus far described may be generally as described in UK patent application No. 0620134.7.

In this embodiment, the material composition along the elongate low-dimensional structures 5 is varied during growth of the elongate structures such that the material composition changes along the length of the elongate structures. The composition of the elongate low-dimensional structures material will be varied such that at least two sections I and II having different material compositions and/or material composition profiles from one another (ie at least two physically different sections) are present in the elongate structures. This allows at least two physically different devices to be subsequently obtained from one tape-like composite structure like the one shown in FIG. 1. In the example illustrated in FIGS. 1 and 2, two physically different devices 1 and 2 may be fabricated out of one tape-like structure. However, the invention is not limited to two physically different devices and also includes any number of devices larger than two.

In the example illustrated in FIG. 1, a plurality of sub-sections 1a, 1a, 2a, 2a are defined along the elongate low-dimensional structures such that their physical properties are particularly suited for the formation of contacts (four such subsections are defined in FIG. 1, but the invention is not limited to this number). For simplicity, two contact regions are labelled 1a and two contact regions are labelled 2a. If electrical contacts are to be formed in these regions 1a and 2a, it may be desired that these regions are distinguishable from other regions by having a very low electrical resistivity. In the case of elongate low-dimensional structures consisting of a semiconducting material, this can be achieved by incorporating a sufficiently large amount of doping atoms during the creation of these segments. In this example, the contact regions 1a are separated by a first active device region 1b (that will ultimately form the active region of one device) while the contact regions 2a are separated by a second active device region 2b (that will ultimately form the active region of another device). In this embodiment, the sub-sections comprising the active device region 1b and the contact regions 1a will consist predominantly of a different material composition from one another. Similar considerations apply to contact regions 2a and active device region 2b. However, more importantly, the material composition in sub-sections 1a differs from the material composition in sub-sections 2a and/or the material composition in sub-sections 1b differs from the material composition in sub-sections 2b. Consequently, the material composition profile in section I differs from the material composition profile of section II, rendering both sections to be physically different.

In the example given above of fabricating an $n^+$ $n^-$ $n^+$ transistor as a first device and an $p^+$ $n^-$ $p^+$ transistor as a second device, the contact regions 1a would differ from the contact regions 1b, but the active device region 1a need not differ from the active device region 1b. In another example, for example the fabrication of light-emitting devices, the active device region 1a would differ from the active device region 1b (to give different optical emission properties) but the contact regions 1a need not differ from the contact regions 1b. In further examples, the contact regions 1a may differ from the contact regions 1b and the active device region 1a may differ from the active device region 1b.

The section I of an elongate structure containing an active device region 1b will be different from (eg, will have a different material composition, a different material composition profile, a different geometry etc) from the section II of the elongate structure containing the active device region 2b. Subsequently, section I is processed further forming one device which is made up of sub-sections 1a and 1b, while section II is processed further forming the other device which is made up of sub-sections 2a and 2b. In this example, the sections I and II are different in terms of doping concentration and doping profile, but this may also coincide with a change in diameter. For example, different gas compositions and possibly also temperatures used for the growth will change the surface tension of the metal catalyst required to grow nanowires. This will change the shape of the liquid catalyst, hence its contact area on the nanowire and could finally result in a different nanowire diameter.

Next, the elongate low-dimensional structures 5 are encapsulated in a matrix 6 (FIG. 1(c)). This may be achieved by a conformal deposition process creating one or more layers of encapsulant material over all the exposed surfaces of the elongate low-dimensional structures and the substrate 3 to form the matrix 6, for example using a substantially isotropic deposition method such as chemical vapour deposition. It may be advantageous if the matrix 6 is formed to a thickness sufficient to fill the spaces between adjacent elongate low-dimensional structures.

A substantially isotropic deposition method ensures that all elongate low-dimensional structures are placed in the centre of the matrix, and this is true for any fin-like structure formed on a common substrate. Furthermore, if the elongate low-dimensional structures belonging to one fin-like structures are fabricated such that they are positioned substantially within one common plane (e.g. all of the longest axes of each structure lie within the same plane). knowing the exact position of the elongate structures is advantageous for subsequent processing steps. It is also beneficial if the matrix material used is sufficiently rigid to avoid any substantial bending of the elongate low-dimensional structures. The use of a rigid or semi-rigid matrix and obtaining elongate structures positioned in the centre of the fin reduces the strain inserted on the elongate structures due to forces applied to the fin. These forces may either occur in subsequent processing steps (e.g. transfer and bonding of the fin to another substrate) or in the final product (e.g. flexible displays). UK patent application No. 0620134.7, discloses a method with which structures fulfilling these requirements can be obtained.

Furthermore, the use of the method disclosed in co-pending UK patent application No. 0620134.7 to make the structures illustrated in the corresponding figures in this invention makes it possible to harvest the benefits which nanowires offer if the intended application does not require the ability to address individual nanowires but uses the collective response of nanowires operated in parallel. This way, generally envisaged advantages such as improved gating due to wrap-around gates or new phenomena exploiting the low-dimensional geometry can be utilised.

The material(s) used for the matrix 6 in this embodiment is/are constrained to those which are compatible with the particular formation method. In a case where a chemical vapour deposition process is used, suitable materials include silica and degeneratively doped polysilicon. Atomic layer deposition may be applied to deposit materials with a higher dielectric constant. Depending on the desired final structure, the matrix 6 may be, for example, light-transmissive, electrically conductive, electrically insulating etc.

The elongate low-dimensional structures may be encapsulated so as to form one or more groups, as described in UK patent application No. 0620134.7. FIG. 1(c) shows elongate structures encapsulated as a group to form a "fin-type structure". Additional details in how to fabricate the fin-type structure shown in FIG. 1(c) can be found in UK patent application No. 0620134.7, the contents of which are hereby incorporated by reference.

Next, the fin-type structure 1(c) is rotated. This rotation may be done on the formation substrate 3, or after transfer to a different substrate 7 yielding the configuration illustrated in FIG. 2(a).

Since the contact area between the fin-type structure shown in FIG. 1(c) and the substrate 3 is relatively low, it is much easier to remove this fin-type structure from the substrate 3 than it is to remove the composite structure of U.S. Pat. No. 7,091,120 from its formation substrate. It is also important to note that, if several sufficiently-spaced fin-type structure are produced on one planar substrate surface according to the method illustrated in FIG. 1, and if these are rotated to arrive at the arrangement illustrated in FIG. 2(a), all elongate structures are coplanar.

The invention is not limited to fin-like structures which are transferred to a different substrate, but may be also applied to individual elongate structures which may or may not be encapsulated and it may also apply to non-transferred structures (e.g. where substrate 3 and substrate 7 are the same substrate).

Alternatively, the nanowires may be fabricated on the substrate 7 but such that they are not initially oriented parallel to the substrate, and then re-oriented so as to extend generally parallel to the substrate 7—for example the nanowires may be fabricated with a flexible joint as disclosed in co-pending UK patent application No. 0805846.3, the contents of which are hereby incorporated by reference, so as to facilitate re-orientation of the nanowires so as to extend generally parallel to the substrate 7.

The method of UK patent application. No. 0805846.3 comprises forming a flexible element in a low-dimensional structure, for example a nanowire, such that the flexible element has different elastic properties to a body portion of the low-dimensional structure.

In principle, the flexible element of UK patent application No. 0805846.3 may be formed as the low dimensional structures are grown. For example, the flexible element may be realised by providing one or more of the nanowires with a portion having a reduced cross-section dimension. When nanowires are grown using a metal catalyst, the surface tension of the catalytic metal used during growth of nanowires affects the contact area between the catalyst and the already grown parts of the nanowires. This contact area determines the nanowire diameter. Varying the surface tension, for example by varying the temperature and/or gas-composition, will thus affect the diameter of the nanowires and allow the nanowires to be grown with a section having a reduced diameter, compared to the diameter of the nanowires at other points along their lengths. In general, however, it is expected that it will be more convenient to form the flexible element after the elongate structures have been grown.

Providing the flexible element of UK patent application No. 0805846.3 may comprise providing, in a low-dimensional structure, a first portion that has different elastic properties to a second portion, the first portion being at a different axial position along the low-dimensional structure to the second portion. Providing the flexible element may comprise reducing the stiffness of this portion, or forming the portion with a lower stiffness, in comparison to the other sections—by either realising a reduced second moment of area of the first portion or by choosing a lower elastic modulus or both.

Forming the flexible element of UK patent application No. 0805846.3 may comprise making a cross-sectional dimension of a first portion of a low-dimensional structure less than the corresponding cross-sectional dimension of a second portion of the low-dimensional structure, whereby the first portion of the low-dimensional structure comprises the flexible element. For example, in the case of a cylindrical low-dimensional structure, forming the flexible element may comprise making the diameter of the first portion less than the diameter of a second portion. Reducing the diameter of a portion of the low dimensional structure is a straightforward way of obtaining the flexible element, and the properties of the flexible element can be selected by choice of appropriate values for the length and diameter of the reduced-diameter portion of the low dimensional structure. This method is not however limited to reducing the diameter of the first portion, ie to making the first portion smaller in two dimensions, and it may also comprise thinning only one dimension of the first portion. This may be achieved by using a directional etch (eg, physical sputtering, exploiting etches or oxidation steps whose rates depend on the crystal orientation). When applied to a cylindrical low-dimensional structure, this would result in a first portion with a cross-section that is generally oval.

Alternatively, in the method of UK patent application No. 0805846.3 the low-dimensional structures may be adhered to the substrate using a low-elastic modulus adhesive such that the adhesive acts as the flexible element.

In formal terms, what is required to form a flexible element in the method of UK patent application No. 0805846.3 is forming or providing a first portion of a low-dimensional structure with a cross-section that has a lower second moment of area than the cross-section of the second portion.

Where the method of UK patent application No. 0805846.3 is applied to a group of low-dimensional structures, it may not be necessary to reduce the cross-sectional dimension of a portion of each low-dimensional structure in order to form the flexible element. Provided that a sufficient number of the structures are provided with a portion that is sufficiently flexible and strong so that the group of structures as a whole remains connected to the substrate during the re-orientation process it does not matter if others of the low-dimensional structures should fracture when the structures are re-oriented or if others of the low-dimensional structures have inadvertently been over-thinned.

In this embodiment an important function of the matrix 6 is to support/lock the elongate low-dimensional structures 5 in a fixed position relative to one another, so that the position, orientation and alignment of elongate low-dimensional structures 5 in a fin-type structure, relative to other elongate low-dimensional structures in that fin-type structure, are preserved during the removal of the fin-type structure from the formation substrate 3 and its transfer to the target substrate 7, and also to provide a handle by which the elongate low-dimensional structures 5 can be simultaneously detached from the formation substrate 3 and transferred to the target substrate 7.

The term "fin-type" structure is used herein to denote a structure with a high aspect ratio, in which the shortest dimension of the encapsulant (denoted as 'w' in FIGS. 1(*c*) and 2(*a*)), extends parallel to a surface plane to which the structure is attached.

Figure 2:
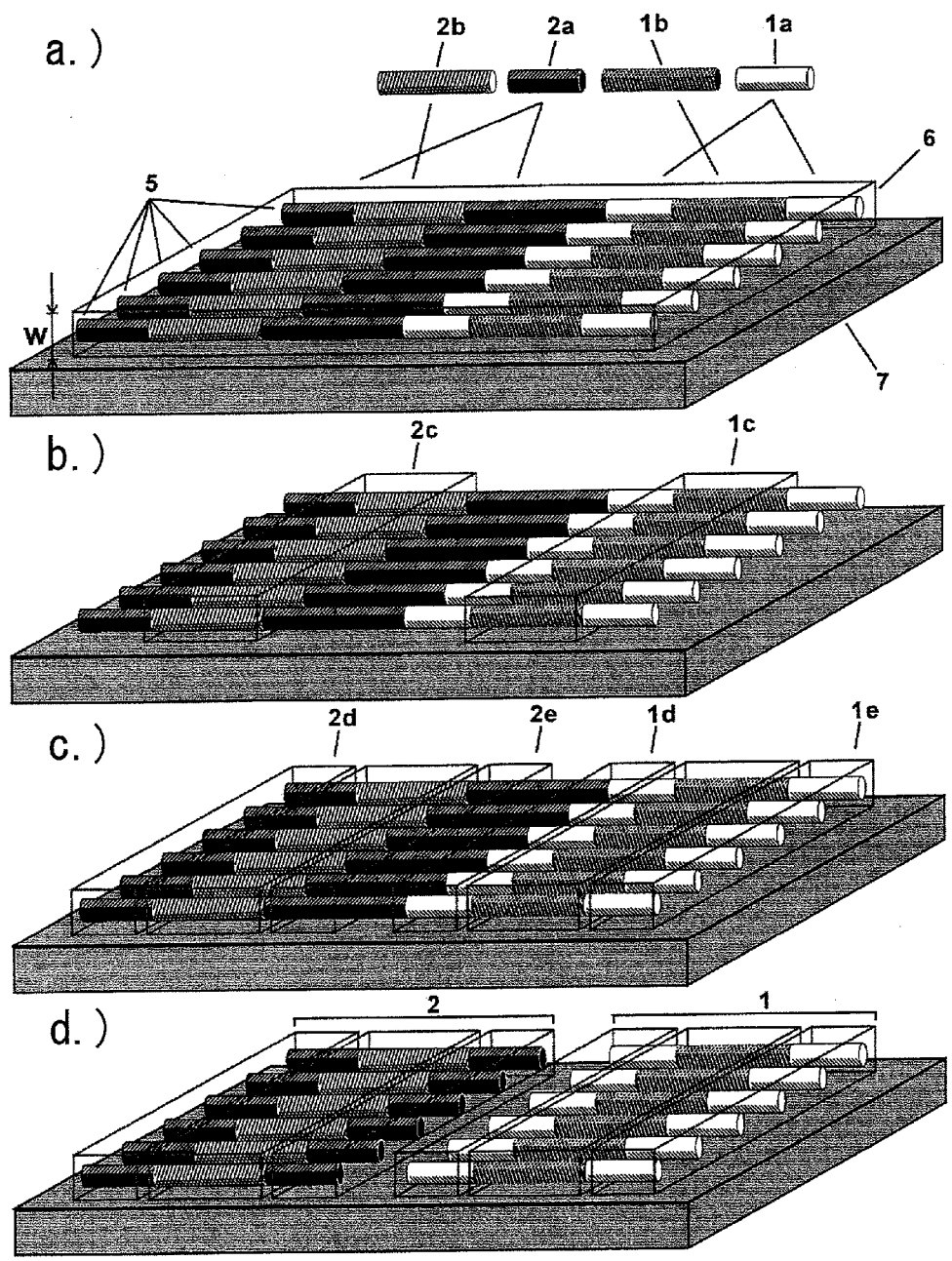
FIG. 2 shows the structures of FIG. 1 being processed further into physically different devices after transfer to another substrate.

The elongate low-dimensional structures may be transferred to the target substrate 7 such that the orientation of the elongate low-dimensional structures 5 relative to the target substrate 7 is different from the orientation of the elongate low-dimensional structures 5 relative to the formation substrate 3. For example, as shown in FIG. 2(*a*), the fin-type structure may be deposited on the target substrate such that the longitudinal axes of the elongate low-dimensional structures 5 extend generally parallel to the target substrate 7. The fin-type structure thus becomes a "tape-type structure" on the target substrate 7. The term "tape-type" structure is used herein to denote a structure with a high aspect ratio, in which the shortest dimension 'w' of the encapsulant (shown in FIG. 2(*a*)) extends perpendicular to a surface plane to which the structure is attached.

In addition to the particular variation of the material composition along the elongate low-dimensional structures 5, this invention differs from UK patent application No. 0620134.7 in the way the tape-type structure is patterned and contacts are formed.

Once the fin-type structure has been transferred to the target substrate 7, the matrix 6 can optionally be partially or completely removed to leave an array of partially or completely exposed elongate low-dimensional structures 5 that can be subsequently processed into at least two physically different devices 1 and 2 along the largest dimension of the elongate low-dimensional structures 5.

In the example illustrated in FIG. 2(*b*) the matrix 5 is partially removed to expose the contact regions 1*a* and contact regions 2*a*. Portions of the matrix that remain form contacts 1*c* and 2*c* to sub-sections of the elongate structures, in this example to the sub-sections 1*b*,2*b* that will form the active regions of the devices. The exposed contact regions 1*a* and 2*a* are subsequently encapsulated with a suitable contact material 1*d*, 1*e*, 2*d*, and 2*e*, as shown in FIG. 2(*c*). If electrical contacts are desired, materials with a high electrical conductivity from the group of metals or silicides may be desirable. Finally, some or all of the material of the elongate low-dimensional structures may be removed between contact 1*d* and contact 2*e* by using subtractive techniques to physically separate device 1 from device 2 (FIG. 2(*d*)).

In this way, a circuit structure that includes two physically different three-terminal devices 1 and 2 may be obtained on substrate 7. In this example, each device contains the same number of elongate structures. The devices are in close proximity to one another and each pair of nanowires which previously formed, before its separation into two nanowires, one nanowire will be well aligned to each other (eg, the longest dimension of one nanowire of the pair lies substantially on the same axis as the longest dimension of the other nanowire of the pair) while, in the case of a circular cross section, the ratio of the radii of both nanowires formerly belonging to one nanowire will differ less from nanowire to nanowire than the absolute values of the radii.

In this embodiment, the material composition, material composition profile, cross-section geometry, orientation of cross-sections, cross-sectional dimensions and orientation of the elongate low-dimensional structures of the first device are nominally the same for all elongate low-dimensional structures of the first device 1. Similarly, the material composition, material composition profile, cross-section geometry, orientation of cross-sections, cross-sectional dimensions and orientation of the elongate low-dimensional structures of the second device are nominally the same for all elongate low-dimensional structures of the second device 2. However, at least one of the material composition, material composition profile, cross-section geometry, cross-sectional dimensions and orientation of the elongate low-dimensional structures of the first device 1 differs from the material composition, material composition profile, cross-section geometry, cross-sectional dimensions and orientation of the elongate low-dimensional structures of the second device 2, so that the first device is physically different from the second device.

Figure 8:
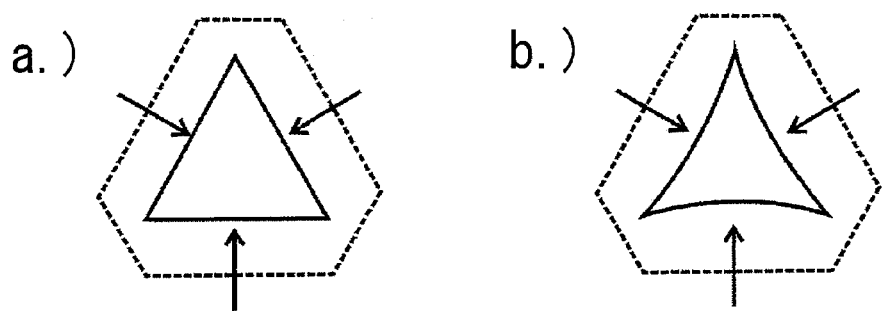
FIG. 8 illustrates that the formation of cross-sectional areas may also result in different cross-sectional geometries.

In connection with the term "orientation of cross-sections", nanowires and other elongate structures are typically grown on a crystalline substrate and the crystal orientation of the substrate will determine the cross-sectional geometry of the elongate structure and (assuming that the cross-section is not circular) its orientation with respect to the longest axis of the structure. Since the structures are all formed on the same substrate they should, after being transferred to a different substrate, still have the same orientation with respect to each other assuming that, for example, the tape-approach of co-pending UK patent application No. 0620134.7 is used to "lock them in". Moreover, the orientation of the cross-sections may now be characterised with respect to the different substrate. This would not be the case, however, if the elongate structures were dispersed in solution and rearranged, as they might then have different orientation or cross-section as they might be rotated along their longest axis. (It should be noted that the geometry of the cross section may change owing to subsequent processing, for example as described below with reference to FIG. 8.)

Provided that the elongate structures shown in FIG. 2(*a*) were transferred to the substrate 7 in such a way to preserve the orientation of their cross-sections, as originally grown on the substrate 3, all elongate structures in the first device should have the same orientation of cross-section as one another, and all elongate structures in the second device should have the same orientation of cross-section as one another. However, the elongate structures in the second device need not have the same orientation of cross-section as the elongate structures in the first device, for example if the elongate structures were grown such that section I of the structures had a different orientation of cross-section (or even a different cross-section) to section II of the structures.

The typical spacing between the devices 1,2 depends on the method used to define the devices. If, for example, the devices do not need to be electrically insulated from each other by removing sections of the nanowires, the spacing is defined by the control available from the growth tool. CVD and MBE systems can switch from one material to the next within a few, sometimes even one, atomic layer. Also, if a special section can be etched much faster than another one because it is more selective to a particular etch, the technique used to grow the nanowires may ultimately define the spacing.

If, on the other hand the nanowires need to be broken up by removing sections in order to define different, electrically insulated devices, without the possibility of defining a suitable different sacrificial material, the spacing between devices will depend on:

1. The resolution of the lithography used to define the gap between the devices

2. The variation of the expected position of each tape. This would depend on the quality of the transfer of the tape if the tapes are to be transferred to a target substrate: e.g. most adhesives require higher temperatures allowing to cross-link them. Furthermore, they are fairly compliant at high temperatures. As a result, different thermal expansion coefficients between the fabrication substrate and the target substrate and the softness/flow of the adhesive may result the tapes to end up in different positions. These variations need to be taken care of if (optical) lithography is used for separating the nanowires into different segments—e.g. by choosing a larger gap. However, this situation would be worse if two transfers which need to be aligned with respect to each other are required because now the variations mentioned above may be less uniform—be different for the first transfer compared to the second transfer, while in addition the second transfer needs to be aligned to the first transfer.

The spacing between two devices that may be obtained will depend on the resolution of the lithography and the uniformity of the transfer, but not in addition to the alignment accuracy of the transfer (the alignment accuracy of the transfer will be probably worse than the precision of lithography and uniformity of the transfer due to the reasons mentioned above). The present invention can therefore reliably produce smaller device spacings than can prior methods.

One particular example where this outcome is desirable would be the realisation of Si-based CMOS circuits on glass substrates. If substrate 7 is glass, and if the elongate low-dimensional structures 5 consist of silicon with contact regions 1a being highly p-doped, contact regions 2a being highly n-doped, active device region 1b being n-doped and active device region 2b being p-doped one would obtain npn and pnp transistors. Contact 1c and contact 2c would be the gates, contact 1d and contact 2d the drains, while contact 1e and contact 2e would be the sources.

Figure 3:
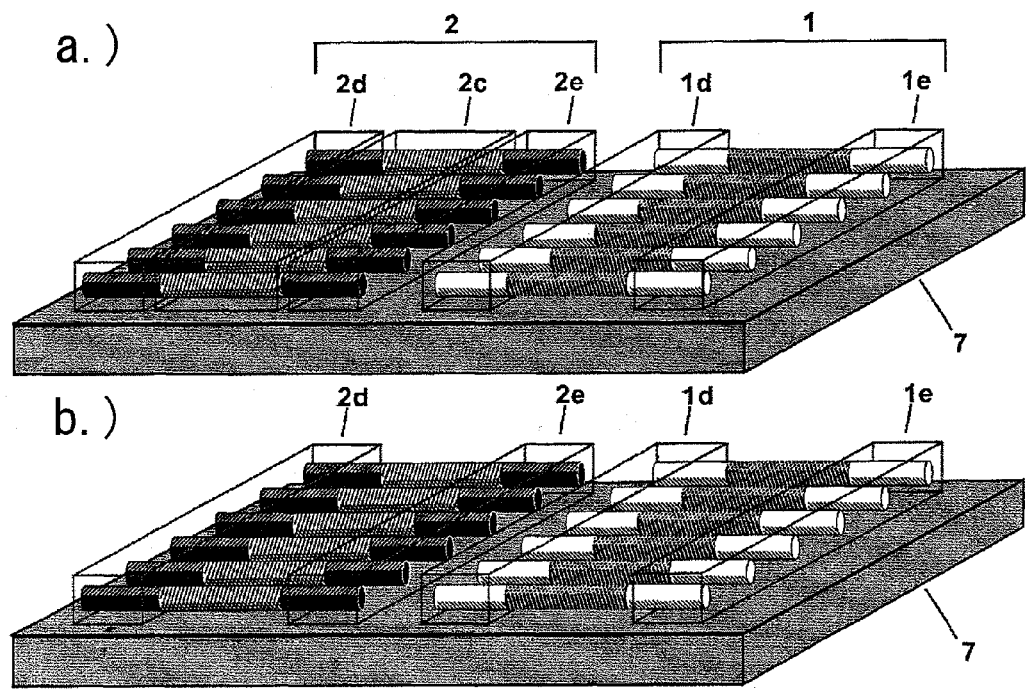
FIG. 3 illustrates further examples of structures obtainable by the invention.

In another embodiment it might be desirable to combine one or more two terminal devices such as sensors or light emitting devices with one or more three terminal devices such as transistors. In this case, the example in FIG. 3(a) illustrates the corresponding outcome where one terminal (in this particular case contact 1c as it is labelled in FIG. 2(b)) has been removed for example, during removal of the matrix 5. This produces a structure containing one two-terminal device 1 and one three-terminal device 2. The resulting two-terminal device could, for example, be a sensor where the active device region is now exposed to the environment. If a light emitting diode is to be integrated with a transistor it might be advantageous to use a transparent matrix 6, allowing the matrix to be left around the active region of the light emitting diode which may have a positive impact on the device performance and device lifetime. However, as most transparent materials are poor conductors, it might be necessary to replace the remaining matrix (labelled as 2c in FIG. 2(b)) on device 2 with a metal contact 2c to form a suitable transistor (e.g. a MES-FET).

In yet another embodiment two or more physically different two-terminal devices might be desired for example to integrate light emitting devices each emitting at a different wavelength, on glass substrate. In this case, contacts 1c and 2c as labelled in FIG. 2(b) might be removed unless they consist of a suitable transparent and non-conductive material. Such a material could be silicon dioxide or silicon nitride. For display applications it might be particularly attractive to integrate more than 2 devices emitting light at more than 2 different wavelengths in the red, green and blue spectrum. FIG. 3(b) shows a structure containing two two-terminal devices.

Figure 4:
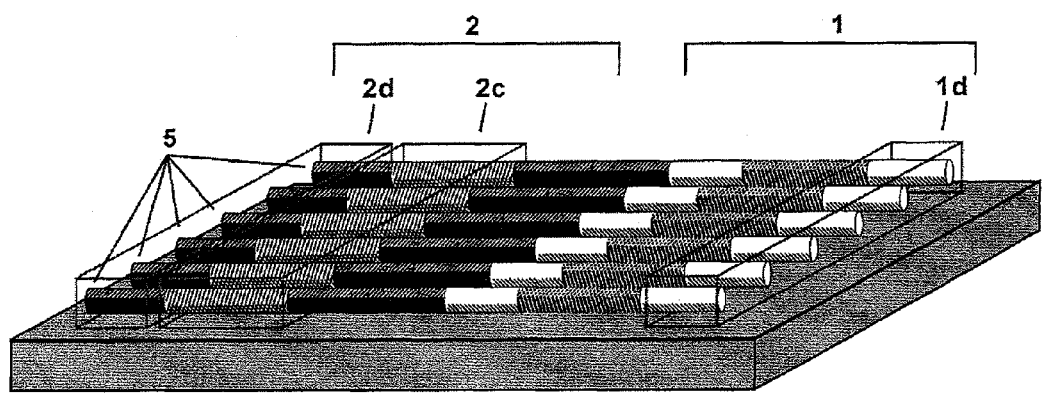
FIG. 4 illustrates a further example of a structure obtainable by the present invention.

In another embodiment of this invention, no segments of the elongate low-dimensional structures 5 are removed because their physical separation may not be desired. FIG. 4 illustrates such an example where contacts 2e and 1d of FIG. 3(a) are not fabricated [FIG. 4], yielding one three-terminal device 2 and one one-terminal device 1—contact 1d is common to both devices. Device 2 may be a transistor switching device 1, which may be a light-emitting device or a sensor.

Figure 5:
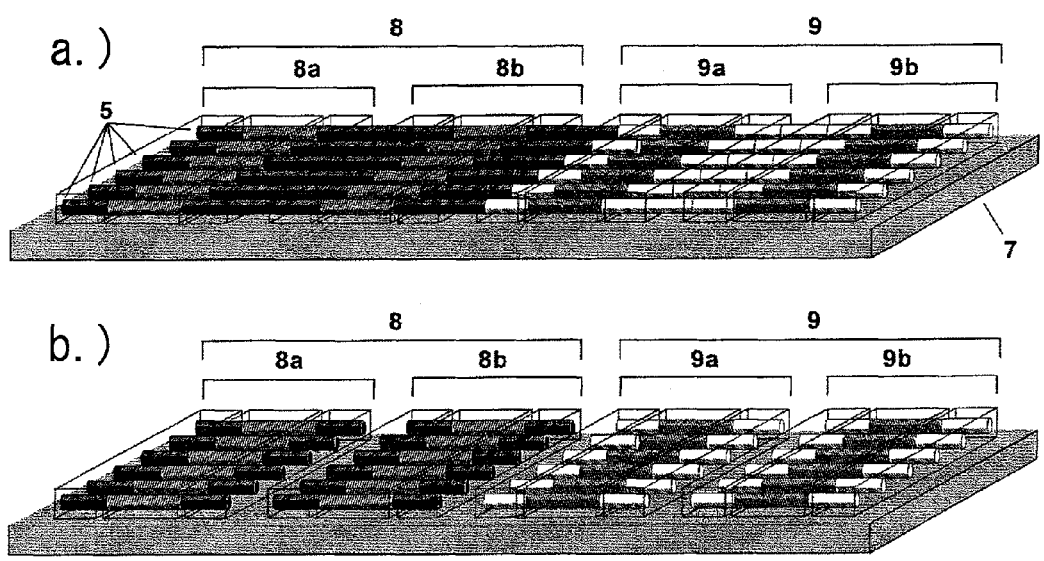
FIG. 5 illustrates further structures obtainable by the present invention.

In yet another embodiment of this invention, the concept described is extended to groups of devices, each group containing physically identical devices while devices belonging to different groups are physically different. In one particular example, devices belonging to the same group may be physically adjacent to each other. This is illustrated in FIG. 5, where devices 8a and 8b are physically identical and belong to group 8 and devices 9a and 9b are physically identical and belong to group 9. For clarity it is noted that this invention is not restricted to two devices within two groups but to any number of devices within each group and any number of groups. Furthermore, the spatial arrangement of the devices may be realised in any conceivable order along the largest dimension of the elongate low-dimensional structures. All or some of the devices may be physically separated from each other by removing segments of the elongate low-dimensional structures. FIG. 5(b) shows all devices being physically separated from each other, whereas FIG. 5(a) shows the elongate structures continuous through the devices.

In the figures, the elongate low-dimensional structures are shown as having a uniform cross-section along their length. In general, however, the one-dimensional geometrical parameters describing the cross sections of the elongate low-dimensional structures contained within one device 1 may differ by a factor "m" from the corresponding one dimensional geometrical parameters describing the cross-sections of the corresponding elongate low dimensional structures of a second device 2. The value of "m" does not change significantly between equivalent pairs of devices found on the same receiver substrate.

In the methods of the invention the obtained circuit structure may undergo further processing steps, for example to deposit an insulating layer over the devices and/or to provide conductive leads to the contacts. The substrate 7 may be the final substrate, or it may be an intermediate substrate and the structure may undergo a further transfer to another substrate.

In the previous sections the invention only refers to the implementation of physically different devices by different material compositions and material composition profiles. Next, other means to realise physically different sections are discussed.

The formation of contacts which includes lithography, removing parts of the matrix and depositing a conductive layer is easiest if the matrix 6 is as thin as possible and the elongate low-dimensional structures are lying in a common plane parallel to the substrate. This makes the structures obtainable by the method disclosed in co-pending UK patent application No. 0620134.7 particularly suited.

Figure 6:
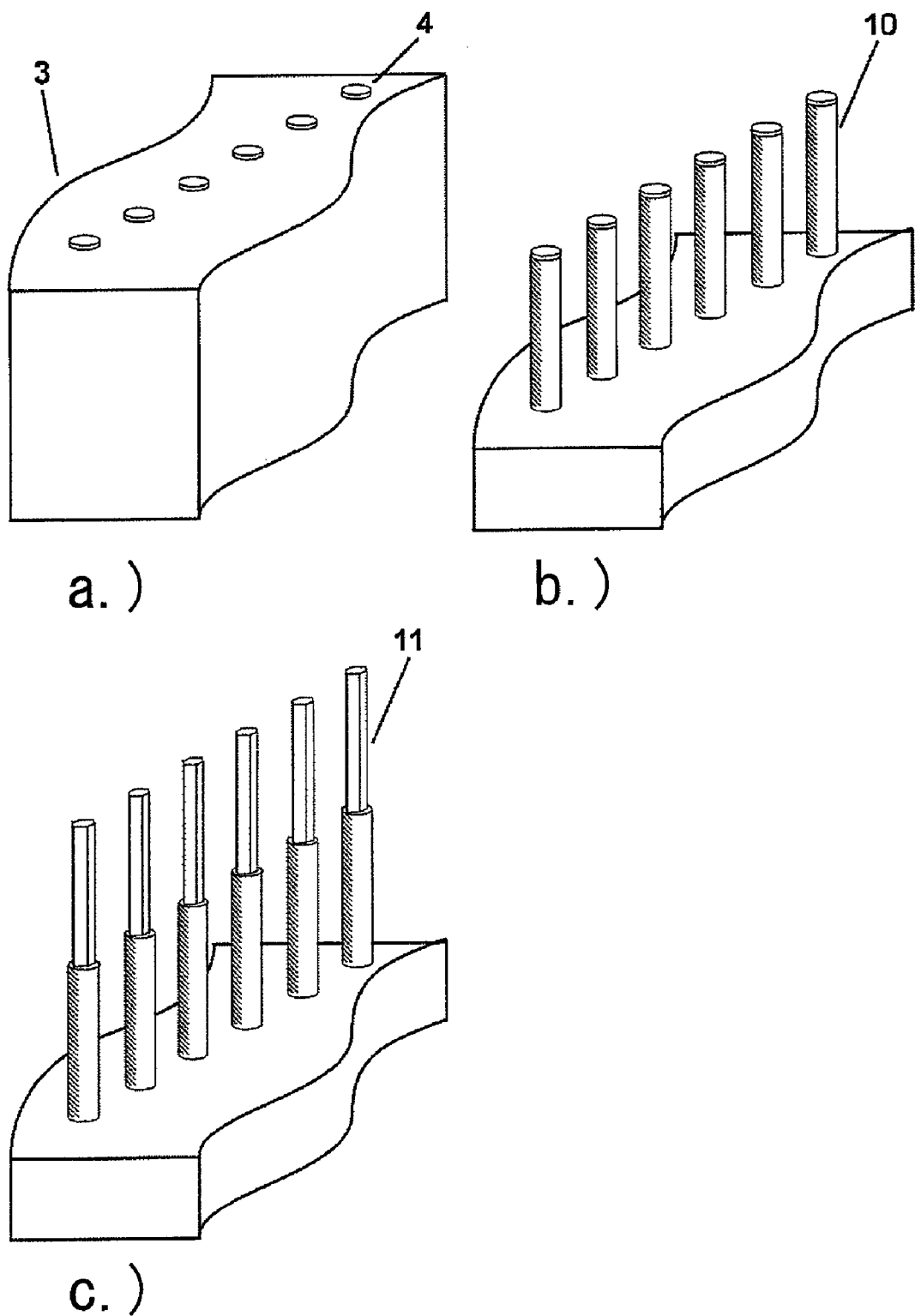
FIG. 6 shows the formation of a group of low dimensional structures on a substrate containing two segments with different cross-sectional geometries and cross sectional areas.
Figure 7:
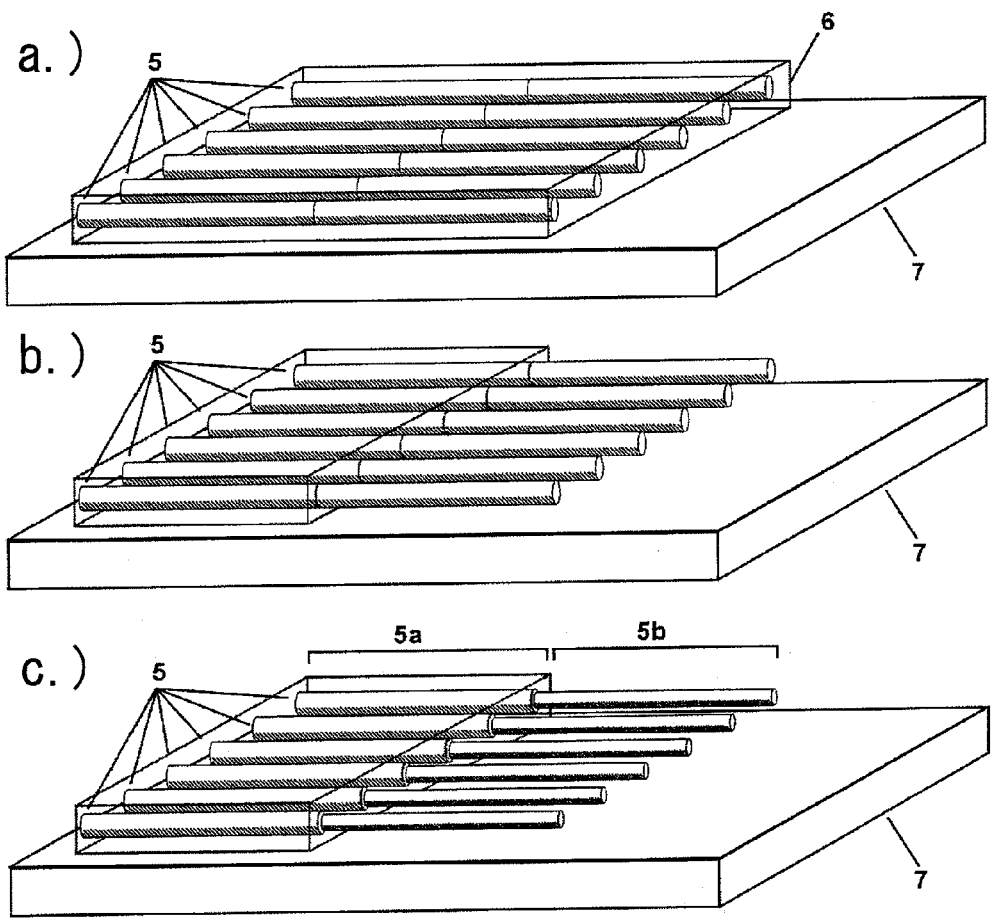
FIG. 7 shows the formation of a group of low dimensional structures on a substrate containing two segments with different cross sectional areas.

FIGS. 6 and 7 illustrate how sections along elongate low dimensional structures with differing cross sectional dimensions and geometries could be realised.

In one example [FIG. 6], the catalyst regions 4 may be used as an etch mask to form nanopillars 10 in substrate 3 by using an anisotropic etch [FIG. 6a-6b]. Subsequently the substrate is heated to the growth temperature where the catalyst may become liquid. As a result, the initially flat and disc-shaped catalyst regions will each form a droplet which will have a smaller contact area with the nanopillars than when it had a disc-shaped geometry (not shown). The diameter of the subsequently grown nanowires 11 is determined by this contact area and as a result the nanowires 11 will have a smaller cross section than the nanopillars 10, as shown in FIG. 6c. Conversely, If the catalyst regions 4 have a greater height than shown in FIG. 6a, this would increase the contact area between a catalyst region and the underlying nanopillar when the catalyst region is heated to its liquid state and it would be possible to finally obtain nanowires 11 with a larger cross sectional area than the one of the nanopillar 10.

FIG. 7 highlights another possibility to modify different segments along elongate low dimensional structures after growth of the low dimensional structures thereby to produce physically different segments, by exposing these sections by partially removing the matrix 6 [FIG. 7a-7b] and subsequently modifying the exposed sections 5b while the sections 5a remain untouched [FIG. 7c]. FIG. 7 illustrates thinning as one example to modify a well defined segment which can be done by any suitable subtractive method or, as in the case of silicon structures, by thermal oxidation and subsequent removal of the oxide. However, other method of modification may include modifying the material composition (e.g. by implantation or diffusion). The low dimensional structures may have been initially grown as free-standing on substrate 7, encapsulated, and rotated to be oriented parallel to the substrate 7. This may involve severing the connection between the free-standing low dimensional structures and the substrate 7, or alternatively, the low dimensional structures may be fabricated on the substrate 7 with a flexible joint as disclosed in co-pending UK patent application No. 0805846.3, so as to facilitate re-orientation of the low dimensional structures so as to extend generally parallel to the substrate 7. Alternatively, the low dimensional structures may have been initially grown as free-standing on a formation substrate and subsequently transferred to substrate 7.

It should be noted that the method of FIG. 7 results in the first and second physically different sections being defined in the elongate structures after the elongate structures have been fabricated, whereas the methods of FIG. 1 or FIG. 6, for example, result in the first and second physically different sections being defined in the elongate structures as the elongate structures are grown on the first substrate 3. That is to say, to reach the stage shown in FIG. 7(a), the elongate structures 5 are grown on a donor substrate, encapsulated in a matrix 6, and transferred to the substrate 7.

The method of FIG. 7 does not require that first and second physically different sections are defined in the elongate structures when the elongate structures are grown.

In principle, it would be possible to apply the method of FIG. 7 to elongate structures in which first and second physically different sections had been defined at the growth stage, to define further sections in the elongate structures.

It is important to note one peculiarity to epitaxial growth of nanowires using a liquid catalyst: It turns out that it is energetically favourable that the nanowire exhibits side-facets which coincide with crystal planes. For example, silicon nanowires grown off a [111] Si surface will generally have a hexagonal cross section with three major side facets and three minor side facets, all corresponding to {112} orientations of the substrate (dashed line in FIG. 8a). Thermal oxidation is not only dependent on crystal orientation and doping concentration, but it also depends on the stress within the already created oxide layers which, in the case of silicon oxidation, influences the diffusion of oxygen to the oxide-silicon interface. As a result a concave surface oxidises faster than a convex surface at reasonably low temperatures (typically below 900 C). This means, that oxidation at minor facets occurs at a much slower rate than at major facets which will change the cross sectional geometry from a hexagonal to a more triangular shape [solid line in FIG. 8a]. For the same reason, the side facets of the triangular cross-section are often curved [solid line in FIG. 8b].

Figure 9:
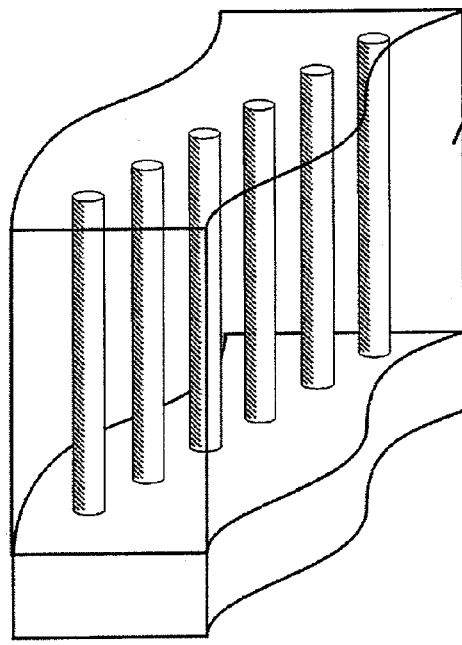
FIG. 9 illustrates steps of a method according to a further embodiment of the invention.
Figure 9:
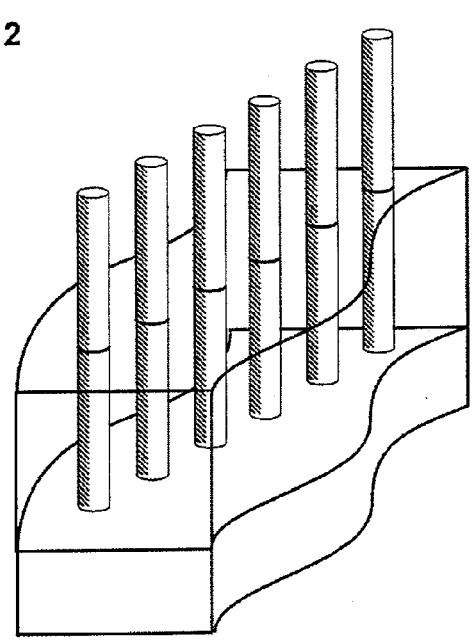
Figure 9:
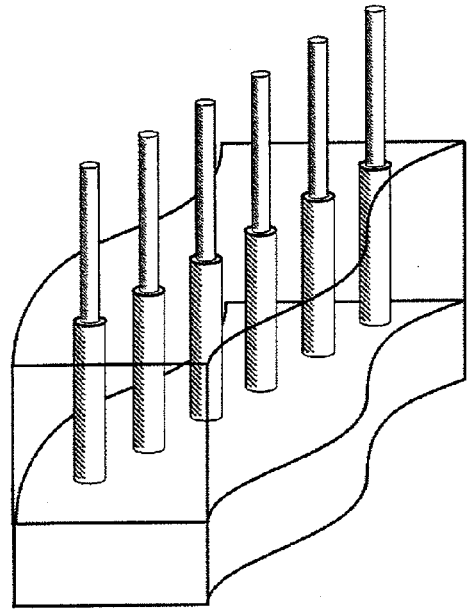
Figure 9:
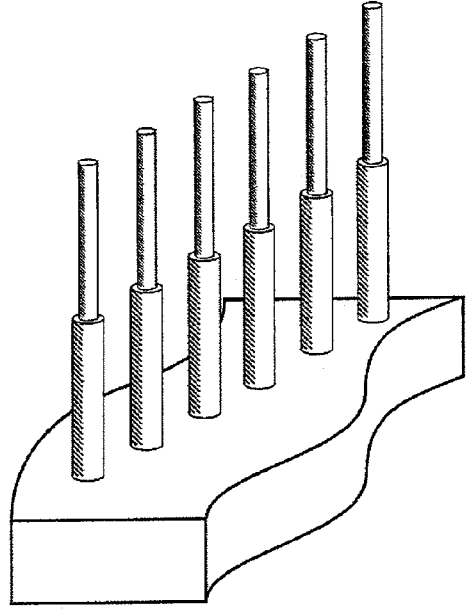

FIG. 9 highlights another possibility to modify different segments along elongate low dimensional structures which were formed as free-standing elongate low dimensional structures. As with the method of FIG. 7, the elongate low dimensional structures are modified after the structures have been fabricated. In the method of FIG. 9 this is done by masking those segments which should remain unaltered. FIG. 9 shows the method applied to elongate low dimensional structures that extend away from, for example generally perpendicular to, a substrate but the method may be applied generally to free-standing elongate low dimensional structures.

Initially, all free-standing elongate structures are immersed in another material 12, say a polymer, which can be for example deposited by spin coating or ink jet printing. Subsequently, this material is partially removed applying a suitable etch (e.g. in the case of a polymer an oxygen plasma may be used) [FIG. 9(b)]. Next, the exposed parts of the elongate structures may be modified, e.g. they may be thinned as shown in FIG. 9c (or alternatively may for example have their material composition changed by implantation or diffusion). Afterwards, the masking material may be removed [FIG. 9d] and the elongate structures may be processed as discussed in previous embodiments. For example, after the low dimensional structures have been modified as described with reference to FIGS. 9(a)-9(d), the connection between the low dimensional structures and the substrate may be severed, for example to allow the low dimensional structures to be re-oriented to be parallel to the substrate or to be transferred to another substrate. Alternatively, the low dimensional structures may be fabricated on the substrate 7 with a flexible joint as disclosed in co-pending UK patent application No. 0805846.3, so as to facilitate re-orientation of the low dimensional structures so as to extend generally parallel to the substrate.

Thus, in the method of FIG. 9 the low-dimensional structures are modified after they have been fabricated, as in the method of FIG. 7. Unlike the method of FIG. 7, however, in the method of FIG. 9 the low-dimensional structures are modified while they are still on the substrate on which they are fabricated.

The density of elongate low dimensional structures can be varied from one section to another section by exploiting different growth rates (e.g. nanowires of different sizes will grow with different growth rates). As a result, the faster growing nanowires could be used to form one device while all nanowires could be used to form the other device, The orientation of the nanowires grown by the method of FIG. 6 may differ from the orientation of the nanopillars if the crystal orientation along the longest dimension of the nanopillar differs from the crystal orientation along the nanowires grow. This change in orientation could be facilitated to obtain a higher nanowire density.

Furthermore, kinks can be introduced during nanowire growth by changing the gas flows (which is often the case if the material composition is about to change.) If these kinks occur for all nanowires in the same direction and if this direction extends partially along the direction described by the row of catalysts 4 in FIG. 1a, once again the density of the elongate low dimensional structures is increased.

Figure 10:
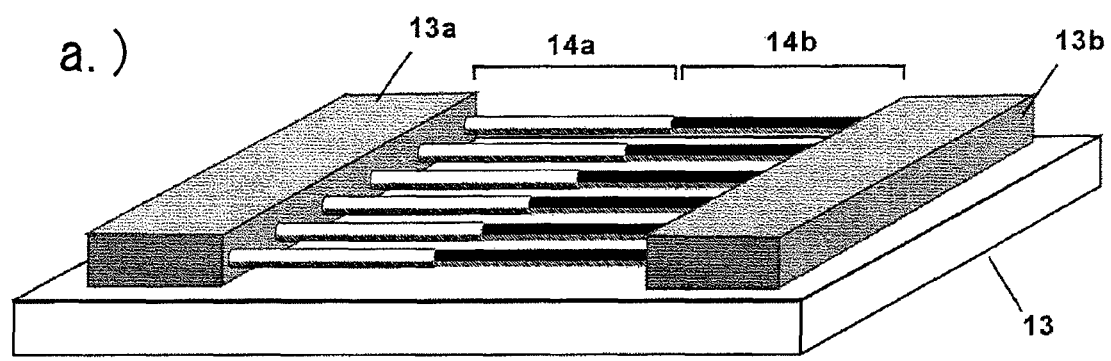
FIG. 10 illustrates steps of a method according to a further embodiment of the invention.
Figure 10:
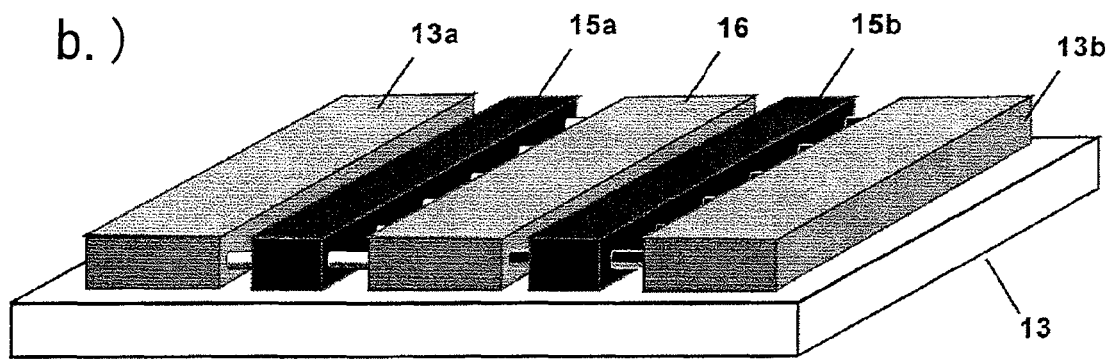

FIG. 10 illustrates another embodiment of this invention where elongate structures are formed between two structures 13a and 13b which are formed on a substrate 13 [FIG. 10(a)].

Substrate 13 may be an insulator such as silicon dioxide, the structures 13*a* and 13*b* may be semiconducting or conducting (e.g. they may consist of silicon or a silicide).

The elongate structures contain physically different sections 14*a* and 14*b*. (Although the sections 14*a*, 14*b* are each shaded uniformly in FIG. 10 they may, as explained above, contain two or more sub-sections of differing properties.)

If three terminal devices such as transistors are desired, the structure may be encapsulated with a thin dielectric layer (not shown) and contacts 15*a* and 15*b* may be formed which remain isolated from the elongate structures by the dielectric layer [FIG. 10(*b*)]. Finally, a electric contact 16 is formed which electrically contacts the elongate structures. The last step requires the removal of the dielectric layer where this contact is to be formed.

Thus, in this embodiment one device comprises the sections 14*a* and the contacts 13*a*, 15*a* and 16, and the second device comprises the sections 14*b* and the contacts 16, 15*b* and 13*b*.

Previous embodiments refer to the fabrication of devices formed using established planar technologies. It was pointed out that this invention is particularly suited if these devices are to be realised not on the substrate on which the elongate structures are formed but on a different substrate. Also, if all elongate structures are to be aligned in parallel to each other the formation of elongate structures protruding vertically off a substrate surface is advantageous. However, it is challenging to process vertical elongate structures into devices which is why the rotation of these structures such that they lie in a plane extending parallel to the substrate surface is often desirable.

Figure 11:
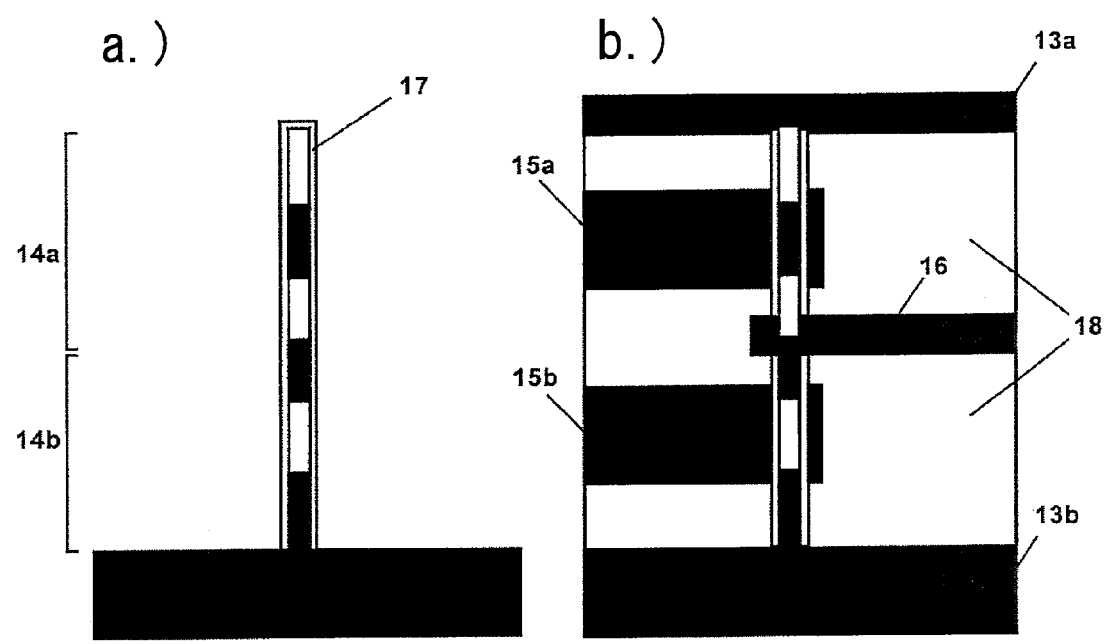
FIG. 11 illustrates steps of a method according to a further embodiment of the invention.

The challenge of applying this invention to a vertical structure containing physically different sections 14*a* and 14*b* such as the one shown in FIG. 11(*a*) without rotating it is illustrated by FIG. 11(*b*): The bottom contact 13*b* can coincide with the substrate from which the elongate structures protrude and the top contact 13*a* may be implemented by encapsulating the structure with a dielectric 18, and polishing this layer to expose the top end of the elongate structures before depositing the contact material. However, the technological challenge lies in fabricating electrical contacts 15*a*, 15*b* and 16 such that they fulfil the same role as the contacts 15*a*, 15*b* and 16 shown in FIG. 10(*b*). This would require contacts 15*a* and 15*b* to be separated from the elongate structures by an insulating dielectric layer 17 while creating contact 16 requires a discontinuous dielectric layer with an opening where the electrical contact is to be formed.

If the structure shown in FIG. 11(*b*) can be realised, an inverter—the basic building block of CMOS circuits—could be formed: the device containing section 14*a* being a p-channel transistor, the device containing 14*b* being an n-channel transistor, 15*a* and 15*b* being one common input, and 16 being the output of the logic gate while an appropriate potential difference is applied to contacts 13*a* and 13*b*.

Figure 12:
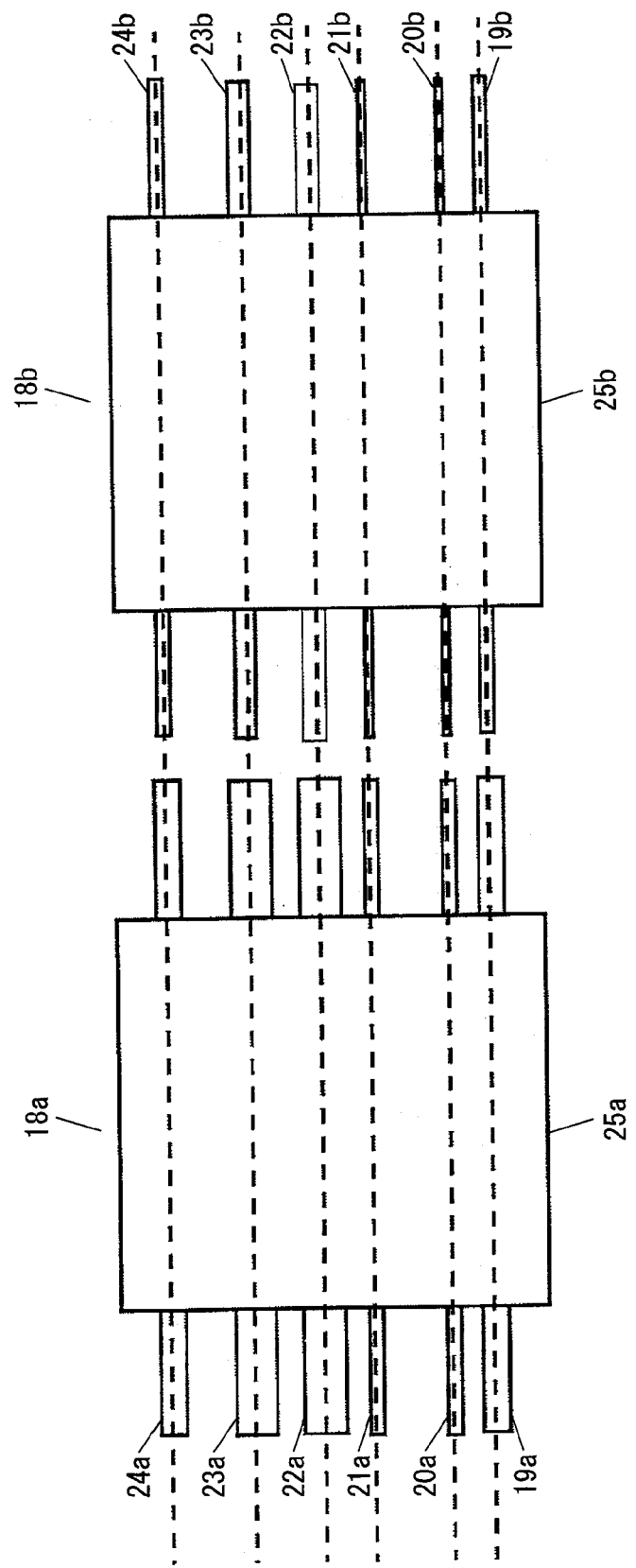
FIG. 12 is a plan view of a device of the invention.

FIG. 12 is a schematic plan view of a pair of devices fabricated by a method of the invention. Each device comprises a plurality of nanowires (or other elongate structures) 19*a*-24*a*, 19*b*-24*b*, partially encapsulated in a matrix denoted schematically as 25*a*,25*b*. The devices have been manufactured by a method in which the nanowires are separated in order to define the two separate devices, so that nanowire 19*a* was originally continuous with nanowire 19*b*, and so on.

Both devices 18*a*,18*b* contain nanowires which lie on common axes (shown as dashed lines), which means that they are extremely well aligned to each other (possibly much better aligned than is achievable by transferring first one device and then the other device onto a common substrate). Also, where the pitch between adjacent nanowires, for example the pitch between nanowire 19*a* and nanowire 19*b* shows variations (e.g. where nanowires have been removed), and/or the nanowire diameter show variations, these variations are substantially similar in both devices. (They may not be identical from one device to another, as nanowires may bend before they are locked in by the matrix. Also, the degree of variations in diameter might be size dependent in the sense that thicker nanowires exhibit, in relation to their size, larger diameter fluctuations as smaller nanowires do, but the overall signature is expected to be substantially similar.) For example, the separation between nanowire 21*a* and nanowire 20*a* in device 18*a* is substantially similar to the separation between nanowire 21*b* and nanowire 20*b* in device 18*b*. Similarly, the ratio between the diameter of nanowire 22*a* and the diameter of nanowire 21*a* in device 18*a* is substantially similar to the ratio between the diameter of nanowire 22*b* and the diameter of nanowire 21*b* in device 18*b*. In general terms, the cross sectional geometry and the orientation of the cross-sectional geometry of a nanowire (or other elongate structures) in device 18*a* are substantially similar to the cross sectional geometry and the orientation of the cross-sectional geometry of a corresponding nanowire (or other elongate structures) in device 18*b*.

Additionally, this method will have some advantages if devices need to be "matched", because variations from the desired outcome will affect both devices in a similar way. This could be valuable to, for example, match p-channel with n-channel transistors (where the nanowire diameter determines the channel width) or in light-emitting devices where colours need to be mixed (red green and blue LEDs may have an overall power output which is hard to predict, but the colour should not vary much from one RGB-LED set to the next one—just the intensity).

The present invention is not limited to the description of the embodiments above, but may be altered by a skilled person within the scope of the claims. An embodiment based on a proper combination of technical means disclosed in different embodiments is encompassed in the technical scope of the present invention.

The embodiments and concrete examples of implementation discussed in the foregoing detailed explanation serve solely to illustrate the technical details of the present invention, which should not be narrowly interpreted within the limits of such embodiments and concrete examples, but rather may be applied in many variations within the spirit of the present invention, provided such variations do not exceed the scope of the patent claims set forth below.

What is claimed is:

1. A circuit structure comprising:
   first and second devices disposed or formed over a common substrate, each device containing elongate low-dimensional structures;
   wherein the first device is in close proximity to the second device;
   wherein at least one of a material composition, a material composition profile, a cross-section geometry, a cross-sectional dimensions and an orientation of the elongate low-dimensional structures of the first device differs from a material composition, a material composition profile, a cross-section geometry, a cross-sectional dimensions and an orientation of the elongate low-dimensional structures of the second device, whereby the first device is physically different from the second device;
   wherein the material composition, the material composition profile, the cross-section geometry, the orientation of cross-sections, the cross-sectional dimensions and the orientation of the elongate low-dimensional structures of the first device are nominally the same for all elongate low-dimensional structures of the first device; and wherein the material composition, the material composition profile, the cross-section geometry, the orientation of cross-sections, the cross-sectional dimensions and the orientation of the elongate low-dimensional structures of the second device are nominally the same for all elongate low-dimensional structures of the second device.

2. The structure according to claim 1 wherein an elongate structure of the first device is continuous with an elongate structure of the second device.

3. The structure according to claim 1 wherein an elongate structure of the first device is not continuous with an elongate structure of the second device whereby the first device is physically separated from the second device.

4. The structure according to claim 1 wherein a longest dimension of at least one elongate structure of the first device lies substantially on a common axis with a longest dimension of at least one elongate structure of the second device.

5. The structure according to claim 1 wherein a longest dimension of at least one elongate structure of the first device lies substantially on a common axis with a longest dimension of at least one elongate structure of the second device, and wherein the cross sectional geometry and the orientation of the cross-sectional geometry of these elongate structures are substantially similar.

6. The structure according to claim 4 wherein the first device and the second device each include at least two elongate structures; and wherein a separation between a pair of elongate structures in the first device is substantially equal to a separation between a corresponding pair of elongate structures in the second device.

7. The structure according to claim 1 wherein the first device emits light, in use, in a first wavelength range and the second device emits light, in use, in a second wavelength range different from the first wavelength range.

8. The structure according to claim 1 wherein the first device is a p-channel transistor whose conductance, in use, is dominated by hole transport and the second device is a n-channel transistor whose conductance, in use, is dominated by electron transport.

9. The structure according to claim 1 and comprising a group of first devices and a group of second devices, wherein the material composition and material composition profile of the elongate low-dimensional structures of devices of the first group are nominally the same for all elongate low-dimensional structures of the first group; and wherein the material composition and material composition profile of the elongate low-dimensional structures of devices of the second group are nominally the same for all elongate low-dimensional structures of the second group.

10. The structure according to claim 1 where the elongate structures are coplanar with one another.

11. The circuit structure according to claim 1 wherein the elongate structures are coplanar with one another.

* * * * *